(12) United States Patent
Park et al.

(10) Patent No.: US 10,679,701 B2
(45) Date of Patent: Jun. 9, 2020

(54) SOLID STATE DRIVE DEVICES AND STORAGE SYSTEMS HAVING THE SAME

(71) Applicant: SAMSUNG ELECTRONICS CO., LTD., Suwon-si, Gyeonggi-do (KR)

(72) Inventors: Ji-Won Park, Suwon-si (KR); Ho-Jin Chun, Seoul (KR); Chung-Hyun Ryu, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 35 days.

(21) Appl. No.: 15/333,384

(22) Filed: Oct. 25, 2016

(65) Prior Publication Data
US 2017/0140825 A1 May 18, 2017

(30) Foreign Application Priority Data

Nov. 16, 2015 (KR) .................. 10-2015-0160421

(51) Int. Cl.
| | | |
|---|---|---|
| G11C 16/10 | (2006.01) | |
| G11C 16/34 | (2006.01) | |
| G11C 7/04 | (2006.01) | |
| G06F 3/06 | (2006.01) | |
| G11C 16/30 | (2006.01) | |
| G11C 16/32 | (2006.01) | |

(52) U.S. Cl.
CPC ............ G11C 16/10 (2013.01); G06F 3/0619 (2013.01); G06F 3/0658 (2013.01); G06F 3/0688 (2013.01); G11C 7/04 (2013.01); G11C 16/30 (2013.01); G11C 16/3431 (2013.01); G11C 16/32 (2013.01)

(58) Field of Classification Search
None
See application file for complete search history.

(56) References Cited

U.S. PATENT DOCUMENTS

| | | | |
|---|---|---|---|
| 7,761,681 | B2 | 7/2010 | Jewell et al. |
| 8,412,876 | B2 | 4/2013 | Yu |
| 8,843,700 | B1 * | 9/2014 | Salessi ............... G06F 12/0246 711/103 |
| 9,024,592 | B2 | 5/2015 | Jeon et al. |
| 2013/0047019 | A1 | 2/2013 | Higashi |
| 2013/0055046 | A1 | 2/2013 | Blodgett |
| 2013/0166866 | A1 | 6/2013 | Yerushalmi et al. |

(Continued)

FOREIGN PATENT DOCUMENTS

| | | |
|---|---|---|
| JP | 2012-088780 | 5/2012 |
| KR | 1020140101690 | 8/2014 |

*Primary Examiner* — Douglas King
(74) *Attorney, Agent, or Firm* — F. Chau & Associates, LLC

(57) ABSTRACT

A solid state drive (SSD) device includes nonvolatile memory devices, a controller, a main power supply circuit and an auxiliary reprogram device. The controller controls the nonvolatile memory devices. The main power supply circuit provides an operation voltage to the nonvolatile memory devices and the controller using a supply voltage provided through a power line. The auxiliary reprogram device provides an auxiliary supply voltage to the nonvolatile memory devices and the controller and generates a reprogram command. The controller is configured to, if the SSD is not powered, perform periodically at a first period a reprogram operation on the nonvolatile memory devices.

20 Claims, 19 Drawing Sheets

(56) References Cited

U.S. PATENT DOCUMENTS

| | | |
|---|---|---|
| 2013/0179629 A1 | 7/2013 | Shim et al. |
| 2013/0185606 A1* | 7/2013 | Fai .................... G06F 11/1068 714/704 |
| 2014/0040537 A1* | 2/2014 | Nakashima ......... G06F 12/0246 711/103 |
| 2014/0229131 A1 | 8/2014 | Cohen et al. |
| 2015/0062607 A1 | 3/2015 | Higashi |
| 2015/0113207 A1 | 4/2015 | Shin |
| 2016/0225435 A1* | 8/2016 | Lee ................... G11C 11/40626 |
| 2016/0350002 A1* | 12/2016 | Vergis .................... G06F 12/02 |

* cited by examiner

SOLID STATE DRIVE DEVICES AND STORAGE SYSTEMS HAVING THE SAME

CROSS-REFERENCE TO RELATED APPLICATION

This application claims priority under 35 USC § 119 to Korean Patent Application No. 10-2015-0160421, filed on Nov. 16, 2015 in the Korean Intellectual Property Office (KIPO), the disclosure of which is incorporated by reference herein in its entirety.

TECHNICAL FIELD

The present inventive concept relates to solid state drive (SSD) device and a storage system including the SSD device.

DISCUSSION OF RELATED ART

Solid state drive (SSD) devices include nonvolatile memory devices such as flash memories, and are used as data storages for electronic devices.

SSD devices do not include a mechanical device, such as a motor, and have fast access rates, high densities, and high stabilities.

However, since nonvolatile memory devices included in SSD devices store data by trapping charges, a data retention error caused by the data loss of the SSD devices may occur when the SSD devices are not powered for a long time.

SUMMARY

According to an exemplary embodiment of the present inventive concept, a solid state drive (SSD) device includes nonvolatile memory devices, a controller, a main power supply circuit and an auxiliary reprogram device. The controller controls the nonvolatile memory devices. The main power supply circuit provides an operation voltage to the nonvolatile memory devices and the controller using a supply voltage provided through a power line. The auxiliary reprogram device provides an auxiliary supply voltage to the nonvolatile memory devices and the controller and generates a reprogram command. The controller is configured to, if the SSD is not powered, perform periodically at a first period a reprogram operation on the nonvolatile memory devices.

According to an exemplary embodiment of the present inventive concept, a storage system includes an SSD device and host. The SSD device stores data, The host provides a supply voltage to the SSD device through a power line and controls the SSD device. If the provision of the supply voltage from the host through the power line is stopped, the SSD device generates an auxiliary supply voltage and moves periodically at a first period at least a portion of the data stored in a first physical area of the SSD device to a second physical area of the SSD device using the auxiliary supply voltage.

According to an exemplary embodiment of the present inventive concept, a method of operating an SSD device including nonvolatile memory devices and an auxiliary power storage element is provided as follows. The SSD device determines whether the SSD device receives a supply voltage. If the SSD device receives the supply voltage, the SSD device performs a program operation and a read operation on the nonvolatile memory devices using the supply voltage. If the SSD device does not receive the supply voltage, the SSD device performs a reprogram operation on the nonvolatile memory devices periodically at a first period using an auxiliary supply voltage generated by the auxiliary power storage element.

According to an exemplary embodiment of the present inventive concept, a solid state drive (SSD) device includes nonvolatile memory devices, a controller, a main power supply circuit and an auxiliary reprogram device. The controller controls the nonvolatile memory devices. The main power supply circuit is electrically coupled to the nonvolatile memory devices and the controller. The auxiliary reprogram device including an auxiliary power storage element is electrically coupled to the nonvolatile memory devices and the controller. The main power supply circuit and the auxiliary reprogram device, if the SSD device is powered, provide an operation voltage to the plurality of nonvolatile memory devices and charge the auxiliary power storage element, respectively. The auxiliary reprogram device, if the SSD device is not powered for a predetermined time, generates a reprogram command to the controller.

BRIEF DESCRIPTION OF DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
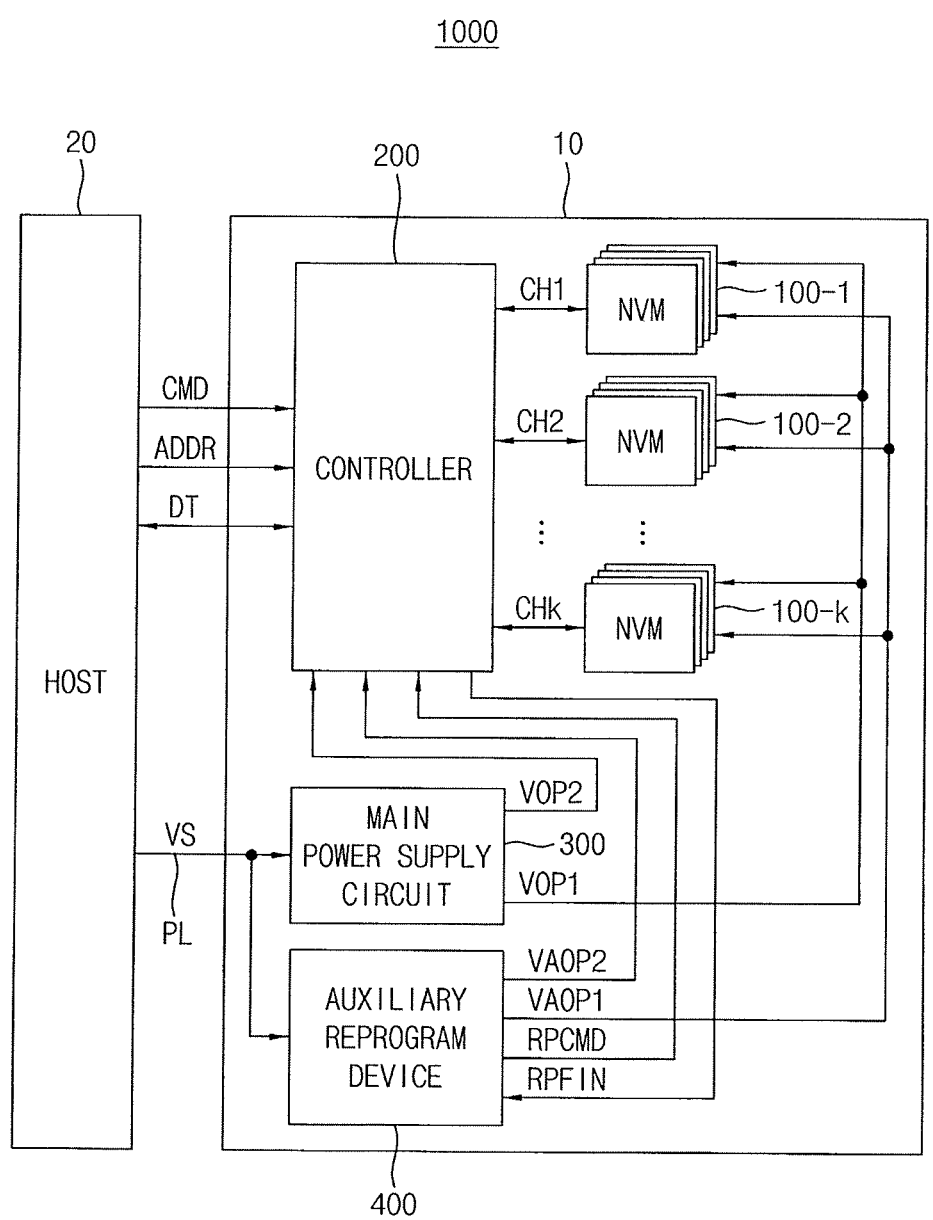
FIG. 1 is a block diagram illustrating a storage system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram illustrating a storage system according to an exemplary embodiment of the present inventive concept.

Referring to FIG. 1, a storage system 1000 includes a solid state drive (SSD) device 10 and a host 20.

The host 20 provides a supply voltage VS to the SSD device 10 through a power line PL, and the SSD device 10 operates using the supply voltage VS provided from the host 20 through the power line PL.

The host 20 controls an operation of the SSD device 10. For example, the host 20 may write data DT to the SSD device 10 and read the data DT from the SSD device 10.

When the SSD device 10 is electrically disconnected from the host 20 or the host 20 is turned off, the provision of the supply voltage VS from the host 20 to the SSD device 10 through the power line PL is stopped and the SSD device 10 may be turned off.

Generally, when a supply voltage is not provided to an SSD device for a long time, data stored in the SSD device may be lost. For example, when the SSD device is not powered, data stored in the SSD device may be lost. Such a data loss may be referred to as a retention error.

In an exemplary embodiment, the SSD device 10 includes an auxiliary power storage element. Therefore, when the provision of the supply voltage VS from the host 20 to the SSD device 10 through the power line PL is stopped, the SSD device 10 may move periodically at a first period at least a portion of the data stored in a first physical area of the SSD device 10 to a second physical area of the SSD device 10 using an auxiliary supply voltage, which is internally generated from the auxiliary power storage element. As such, the SSD device 10 may have an increased data retention performance.

Hereinafter, a structure of the SSD device 10 according to an exemplary embodiment of the present inventive concept will be described with reference to FIG. 1.

Referring to FIG. 1, the SSD device 10 may include a plurality of nonvolatile memory devices NVM 100-1, 100-2, ..., 100-k, a controller 200, a main power supply circuit 300, and an auxiliary reprogram device 400. Here, k represents a positive integer.

The plurality of nonvolatile memory devices 100-1, 100-2, ..., 100-k may be used as a storage medium of the SSD device 10. In an exemplary embodiment, each of the plurality of nonvolatile memory devices 100-1, 100-2, ..., 100-k may include a flash memory.

The controller 200 may be coupled to the plurality of nonvolatile memory devices 100-1, 100-2, ..., 100-k through a plurality of channels CH1, CH2, ..., CHk, respectively.

The controller 200 may receive a command signal CMD and an address signal ADDR from the host 20, and communicate the data DT with the host 20. The controller 200 may control an operation of the plurality of nonvolatile memory devices 100-1, 100-2, ..., 100-k. For example, the controller 200 may write the data DT to the plurality of nonvolatile memory devices 100-1, 100-2, ..., 100-k or read the data DT from plurality of nonvolatile memory devices 100-1, 100-2, ..., 100-k according to the command signal CMD and the address signal ADDR received from the host 20.

The main power supply circuit 300 may receive the supply voltage VS from the host 20 through the power line PL.

When the supply voltage VS is provided from the host 20 through the power line PL, the main power supply circuit 300 may generate a first operation voltage VOP1, which is required for an operation of the plurality of nonvolatile memory devices 100-1, 100-2, ..., 100-k, and a second operation voltage VOP2, which is required for an operation of the controller 200, using the supply voltage VS. For example, the first operation voltage VOP1 may include a plurality of voltages required for operating the plurality of nonvolatile memory devices 100-1, 100-2, ..., 100-k. For example, the second operation voltage VOP2 may include a plurality of voltages required for operating the controller 200. In this case, the plurality of nonvolatile memory devices 100-1, 100-2, ..., 100-k may operate using the first operation voltage VOP1, and the controller 200 may operate using the second operation voltage VOP2.

On the other hand, when the provision of the supply voltage VS from the host 20 through the power line PL is stopped, the main power supply circuit 300 may be turned off without generating the first operation voltage VOP1 and the second operation voltage VOP2. In this case, the plurality of nonvolatile memory devices 100-1, 100-2, ..., 100-k and the controller 200 may be also turned off.

The auxiliary reprogram device 400 may include the auxiliary power storage element generating the auxiliary supply voltage. Therefore, the auxiliary reprogram device 400 may operate using the auxiliary supply voltage.

The auxiliary reprogram device 400 may be coupled to the power line PL. The auxiliary reprogram device 400 may monitor whether the supply voltage VS is provided from the host 20 through the power line PL. When the provision of the supply voltage VS from the host 20 through the power line PL is stopped, the auxiliary reprogram device 400 may control the controller 200 using the auxiliary supply voltage to perform periodically at the first period a reprogram operation on the plurality of nonvolatile memory devices 100-1, 100-2, . . . , 100-k.

For example, when the provision of the supply voltage VS from the host 20 through the power line PL is stopped, the auxiliary reprogram device 400 may generate a first auxiliary operation voltage VAOP1, which is required for an operation of the plurality of nonvolatile memory devices 100-1, 100-2, . . . , 100-k, and a second auxiliary operation voltage VAOP2, which is required for an operation of the controller 200, using the auxiliary supply voltage. For example, the first auxiliary operation voltage VAOP1 may include a plurality of voltages required for operating the plurality of nonvolatile memory devices 100-1, 100-2, . . . , 100-k. For example, the second auxiliary operation voltage VAOP2 may include a plurality of voltages required for operating the controller 200. In this case, the plurality of nonvolatile memory devices 100-1, 100-2, . . . , 100-k may operate using the first auxiliary operation voltage VAOP1, and the controller 200 may operate using the second auxiliary operation voltage VAOP2. In addition, the auxiliary reprogram device 400 may provide a reprogram command RPCMD to the controller 200. The controller 200 may perform the reprogram operation on the plurality of nonvolatile memory devices 100-1, 100-2, . . . , 100-k in response to the reprogram command RPCMD, and provide a reprogram finish signal RPFIN to the auxiliary reprogram device 400 after finishing the reprogram operation. The auxiliary reprogram device 400 may stop generating the first auxiliary operation voltage VAOP1 and the second auxiliary operation voltage VAOP2 in response to the reprogram finish signal RPFIN.

In an exemplary embodiment, the first auxiliary operation voltage VAOP1 and the second auxiliary operation voltage VAOP2, which are generated by the auxiliary reprogram device 400, may be substantially the same as the first operation voltage VOP1 and the second operation voltage VOP2, which are generated by the main power supply circuit 300.

Here, the reprogram operation represents an operation of reading data stored in a first physical area of the plurality of nonvolatile memory devices 100-1, 100-2, . . . , 100-k, programming the read data in a second physical area of the plurality of nonvolatile memory devices 100-1, 100-2, . . . , 100-k, which is different from the first physical area, and erasing the first physical area.

In an exemplary embodiment, the controller 200 may perform the reprogram operation in response to the reprogram command RPCMD by selecting a reprogram block from among a plurality of blocks included in the plurality of nonvolatile memory devices 100-1, 100-2, . . . , 100-k, reading data stored in the reprogram block, programming the read data in another block, and erasing the reprogram block.

In an exemplary embodiment, each of the plurality of blocks included in the plurality of nonvolatile memory devices 100-1, 100-2, . . . , 100-k may correspond to a unit area used when an erase operation is performed on the plurality of nonvolatile memory devices 100-1, 100-2, . . . , 100-k.

A method of selecting the reprogram block from among the plurality of blocks included in the plurality of nonvolatile memory devices 100-1, 100-2, . . . , 100-k will be described later with reference to FIGS. 11 and 12.

Figure 2:
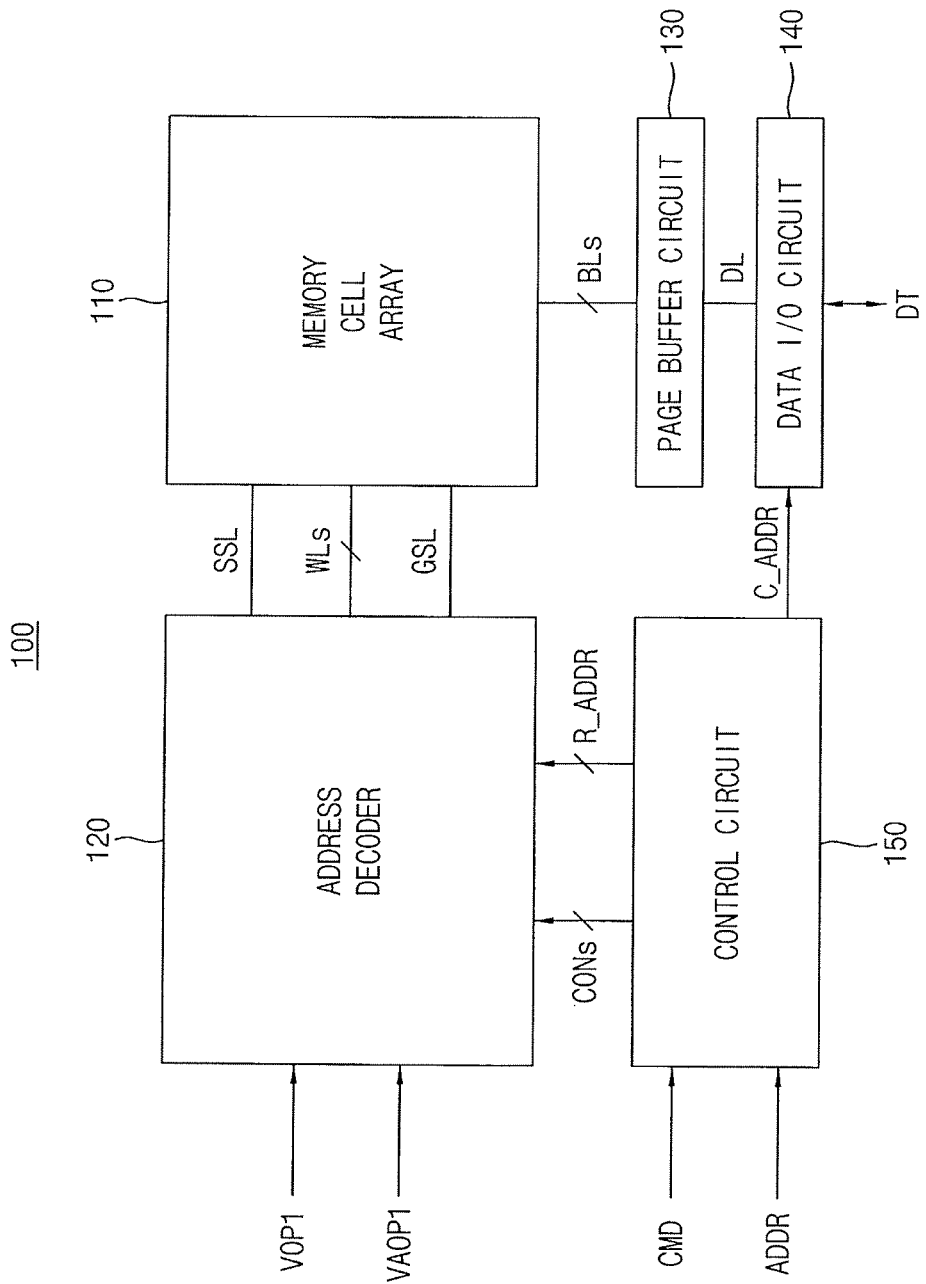
FIG. 2 is a block diagram illustrating an example of a nonvolatile memory device included in a solid state drive (SSD) device of FIG. 1.

FIG. 2 is a block diagram illustrating an example of a nonvolatile memory device included in the SSD device of FIG. 1.

Each of the plurality of nonvolatile memory devices 100-1, 100-2, . . . , 100-k included in the SSD device 10 of FIG. 1 may be implemented with a nonvolatile memory device 100 of FIG. 2.

Referring to FIG. 2, the nonvolatile memory device 100 may include a memory cell array 110, an address decoder 120, a page buffer circuit 130, a data input/output circuit 140, and control circuit 150.

The memory cell array 110 may be coupled to the address decoder 120 through a string selection line SSL, a plurality of word lines WLs, and a ground selection line GSL. In addition, the memory cell array 110 may be coupled to the page buffer circuit 130 through a plurality of bit lines BLs.

The memory cell array 110 may include a plurality of memory cells coupled to the plurality of word lines WLs and the plurality of bit lines BLs.

In an exemplary embodiment, the memory cell array 110 may be a three-dimensional memory cell array, which is formed on a substrate in a three-dimensional structure (or a vertical structure). In this case, the memory cell array 110 may include vertical cell strings that are vertically oriented such that at least one memory cell is located over another memory cell. The following patent documents, which are hereby incorporated by reference, describe configurations for three-dimensional memory cell arrays: U.S. Pat. Nos. 7,679,133; 8,553,466; 8,654,587; 8,559,235; and US Pat. Pub. No. 2011/0233648.

In an exemplary embodiment, the memory cell array 110 may be a two-dimensional memory cell array, which is formed on a substrate in a two-dimensional structure (or a horizontal structure).

Figure 3:
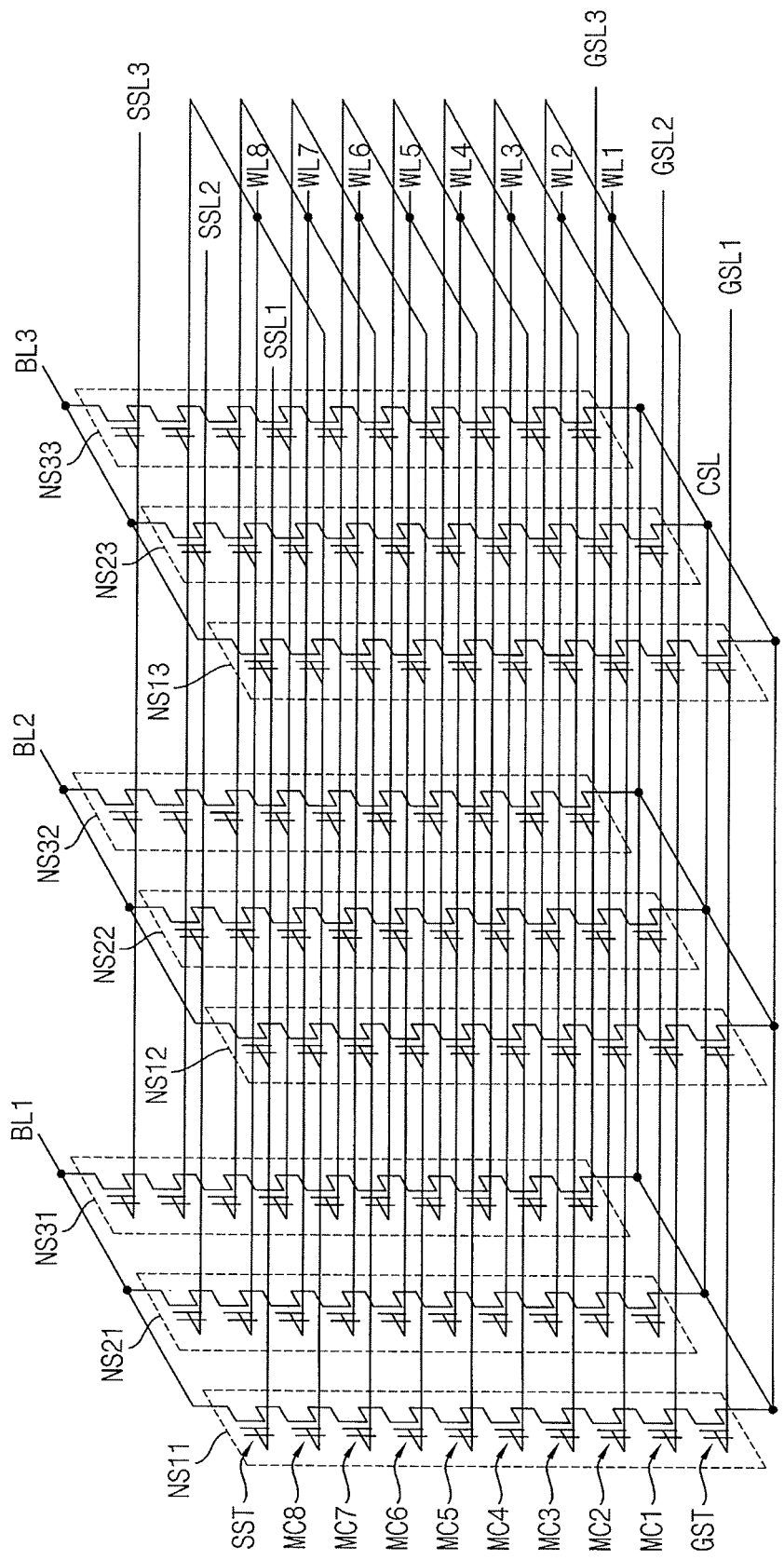
FIG. 3 is a circuit diagrams illustrating an example of a memory cell array included in the nonvolatile memory device of FIG. 2.

FIG. 3 is a circuit diagrams illustrating an example of a memory cell array included in the nonvolatile memory device of FIG. 2.

A memory cell array 110a of FIG. 3 may be formed on a substrate in a three-dimensional structure (or a vertical structure). For example, a plurality of memory cell strings included in the memory cell array 110a may be formed in a direction perpendicular to the substrate.

Referring to FIG. 3, the memory cell array 110a may include memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST.

In FIG. 3, each of the memory cell strings NS11 to NS33 is illustrated to include eight memory cells MC1 to MC8. However, the present inventive concept is not limited thereto. For example, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to corresponding ground selection lines GSL1 to GSL3. The string selection transistor SST may be connected to corresponding bit lines BL1, BL2 and BL3, and the ground selection transistor GST may be connected to the common source line CSL.

Word lines (e.g., WL1) having the same height may be commonly connected, and the ground selection lines GSL1 to GSL3 and the string selection lines SSL1 to SSL3 may be separated.

In FIG. 3, the memory cell array 110a is illustrated to be coupled to eight word lines WL1 to WL8 and three bit lines BL1 to BL3. However, the present inventive concept is not limited thereto. For example, the memory cell array 110a may be coupled to any number of world lines and bit lines.

Figure 4:
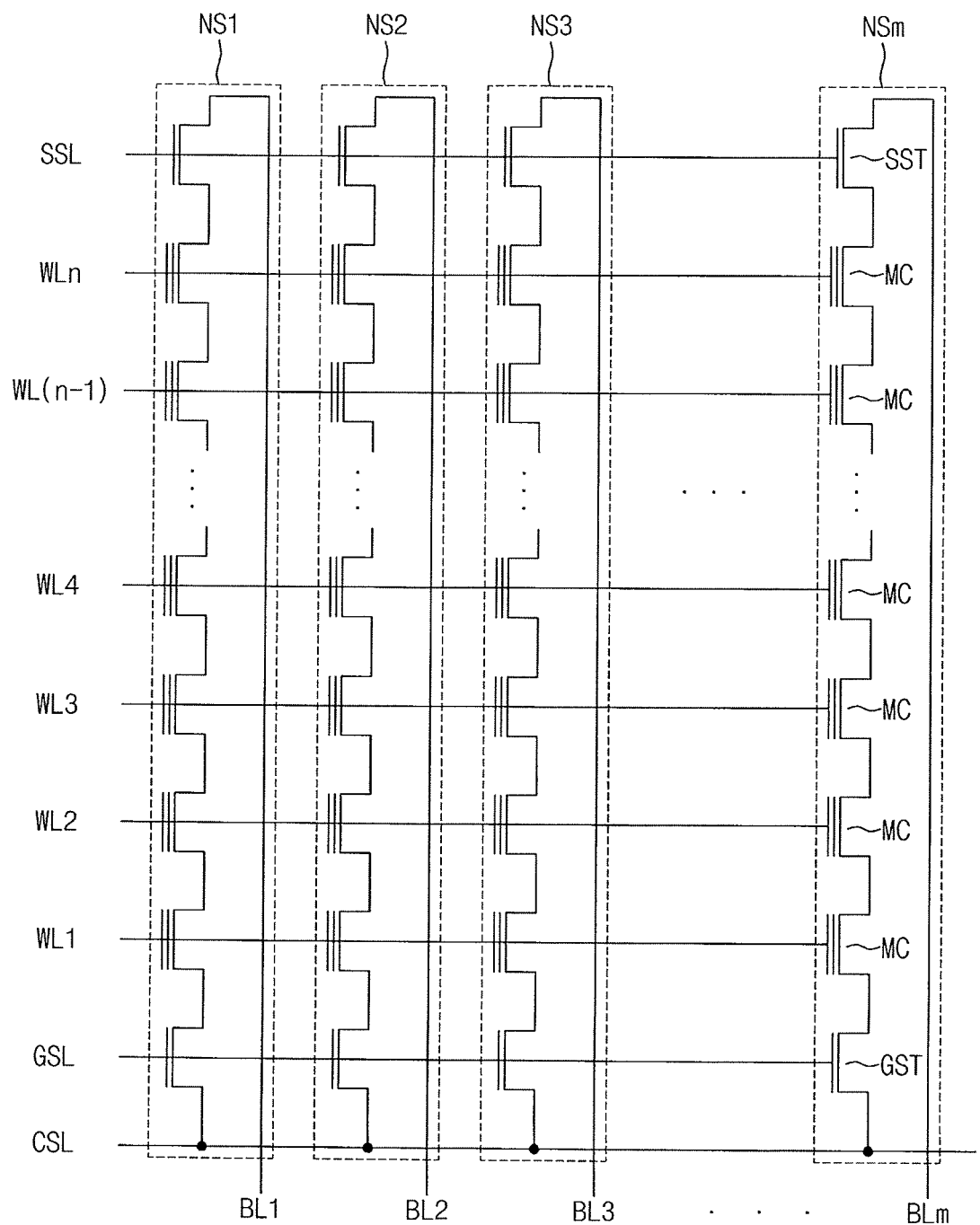
FIG. 4 is a circuit diagrams illustrating a memory cell array included in the nonvolatile memory device of FIG. 2 according to an exemplary embodiment of the present inventive concept.

FIG. 4 is a circuit diagrams illustrating a memory cell array included in the nonvolatile memory device of FIG. 2 according to an exemplary embodiment of the present inventive concept.

A memory cell array 110b of FIG. 4 may be formed on a substrate in a two-dimensional structure (or a horizontal structure). For example, a plurality of memory cell strings included in the memory cell array 110b may be formed in a direction parallel to the substrate.

Referring to FIG. 4, the memory cell array 110b may include memory cell strings NS1 to NSm.

Each of the memory cell strings NS1 to NSm may include a string selection transistor SST, a plurality of memory cells MC, and a ground selection transistor GST that are serially connected to each other.

The string selection transistor SST included in each of the memory cell strings NS1 to NSm may be commonly connected to the string selection line SSL. Memory cells arranged in a same row among memory cells MC included in each of the memory cell strings NS1 to NSm may be commonly connected to corresponding word lines WL1 to WLn. The ground selection transistor GST included in each of the memory cell strings NS1 to NSm may be commonly connected to the ground selection line GSL.

The ground selection transistors GST included in each of the memory cell strings NS1 to NSm may be commonly connected to the common source line CSL.

The string selection transistor SST included in each of the memory cell strings NS1 to NSm may be connected to corresponding bit lines BL1 to BLm.

Here, n and m represent positive integers.

Referring again to FIG. 2, the control circuit 150 may receive the command signal CMD and the address signal ADDR from the controller 200, and control a program operation, a read operation, and an erase operation of the nonvolatile memory device 100 based on the command signal CMD and the address signal ADDR.

For example, the control circuit 150 may generate control signals CONs based on the command signal CMD, and generate a row address R_ADDR and a column address C_ADDR based on the address signal ADDR. The control circuit 150 may provide the control signals CONs and the row address R_ADDR to the address decoder 120 and provide the column address C_ADDR to the data input/output circuit 140.

The address decoder 120 may be coupled to the memory cell array 110 through the string selection line SSL, the plurality of word lines WLs, and the ground selection line GSL. In addition, the address decoder 120 may receive the first operation voltage VOP1 from the main power supply circuit 300 when the supply voltage VS is provided from the host 20 through the power line PL, and receive the first auxiliary operation voltage VAOP1 from the auxiliary reprogram device 400 when the provision of the supply voltage VS from the host 20 through the power line PL is stopped. For example, the first operation voltage VOP1 and the first auxiliary operation voltage VAOP1 may include a program voltage, a pass voltage, and a program verification voltage used in the program operation, a read voltage used in the read operation, and an erase voltage used in the erase operation.

The address decoder 120 may perform the program operation, the read operation, and the erase operation by applying the first operation voltage VOP1 or the first auxiliary operation voltage VAOP1 to the plurality of word lines WLs based on the control signals CONs and the row address R_ADDR.

The page buffer circuit 130 may be coupled to the memory cell array 110 through the plurality of bit lines BLs.

The page buffer circuit 130 may include a plurality of page buffers. In an exemplary embodiment, one page buffer may be connected to one bit line. In an exemplary embodiment, one page buffer may be connected to two or more bit lines.

The page buffer circuit 130 may temporarily store data to be programmed to a selected page or data read out from the selected page.

The data input/output circuit 140 may be coupled to the page buffer circuit 130 through data lines DL.

During the program operation, the data input/output circuit 140 may receive program data DT from the controller 200 and provide the program data DT to the page buffer circuit 130 based on the column address C_ADDR received from the control circuit 150.

During the read operation, the data input/output circuit 140 may provide read data DT, which are stored in the page buffer circuit 130, to the controller 200 based on the column address C_ADDR received from the control circuit 150.

Hereinbefore, an example of the plurality of nonvolatile memory devices 100-1, 100-2, . . . , 100-k included in the SSD device 10 is described with reference to FIGS. 2 to 4. However, the present inventive concept is not limited thereto. For example, each of the plurality of nonvolatile memory devices 100-1, 100-2, . . . , 100-k may be implemented in different structures.

Figure 5A:
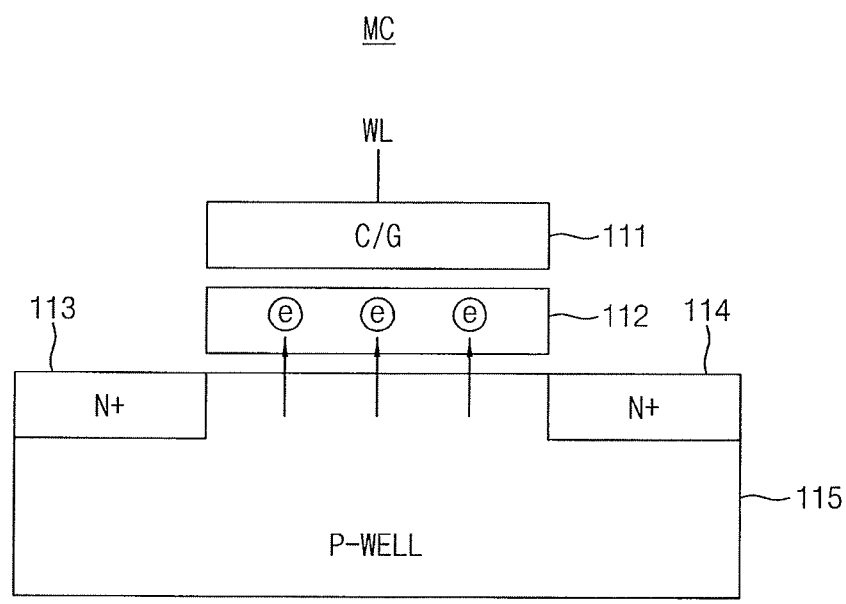
FIGS. 5A and 5B are diagrams for describing a program operation of a memory cell included in a nonvolatile memory device of FIG. 1.
Figure 5B:
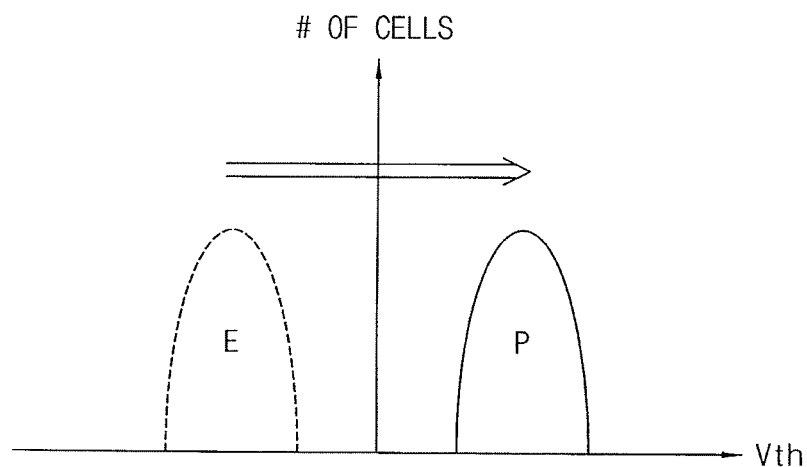
Figure 6A:
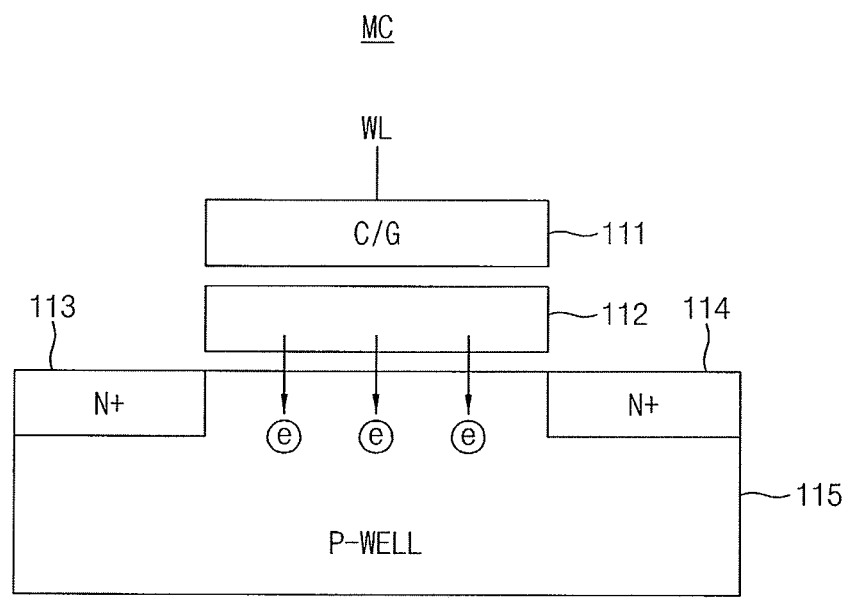
FIGS. 6A and 6B are diagrams for describing a data retention error of a memory cell included in a nonvolatile memory device of FIG. 1.
Figure 6B:
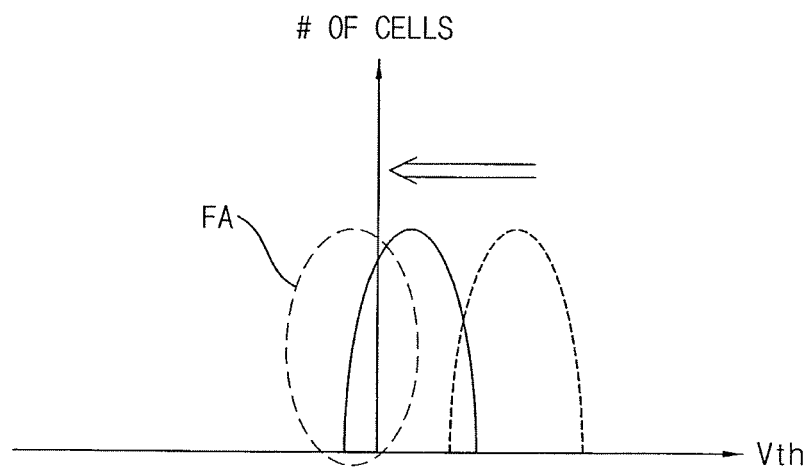

FIGS. 5A and 5B are diagrams for describing a program operation of a memory cell included in the nonvolatile memory device of FIG. 1, and FIGS. 6A and 6B are diagrams for describing a data retention error of a memory cell included in a nonvolatile memory device of FIG. 1.

As illustrated in FIGS. 5A and 6A, the memory cell MC included in each of the plurality of nonvolatile memory devices 100-1, 100-2, . . . , 100-k may include a source N+ 113 and a drain N+ 114 formed on a p-type well 115, a floating gate 112 formed above the p-type well 115, and a control gate 111 formed on the floating gate 112 and coupled to a word line WL.

During the program operation, the program voltage having a high voltage level may be applied to the control gate 111, and a ground voltage may be applied to the source 113, the drain 114, and the p-type well 115. In this case, as illustrated in FIG. 5A, electrons of the p-type well 115 may be trapped in the floating gate 112 through a Fowler-Nordheim (FN) tunneling, such that a threshold voltage Vth of the memory cell MC may increase. Therefore, as illustrated in FIG. 5B, a threshold voltage distribution of the memory cell MC may be changed from an erase state E to a program state P.

However, when the provision of the supply voltage VS from the host 20 to the SSD device 10 through the power line PL is stopped, as illustrated in FIG. 6A, the electrons trapped in the floating gate 112 may be detrapped to the p-type well 115 as time flows, such that the threshold voltage Vth of the memory cell MC may decrease. Therefore, as illustrated in FIG. 6B, the threshold voltage distribution of the memory cell MC may move to the left direction, such that some of the memory cells MC included in the plurality of nonvolatile memory devices 100-1, 100-2, . . . , 100-$k$ may have threshold voltages within a data retention error area FA of FIG. 6A. Data stored in the memory cell MC, which is included in the data retention error area FA, may be lost.

Generally, an SSD device periodically performs a reprogram operation to prevent the data loss. However, a conventional SSD device performs the reprogram operation only when a supply voltage is provided to the conventional SSD device. For example, when the conventional SSD device is powered, the reprogram operation may be performed, but when the conventional SSD device is not powered for a predetermined time, the reprogram operation is not be performed to the extent that data stored in the conventional SSD device may be lost. According to an exemplary embodiment, the SSD device may perform a reprogram operation if the SSD device is not powered for the predetermined time. The SSD device repeatedly performs the reprogram operation until the SSD device is powered. For example, the SSD device according to the inventive concept may performs the reprogram operation periodically at a first period if the SSD device is not powered. The first period may be equal to or less than the predetermined time.

Referring back to FIG. 1, the SSD device 10 according to an exemplary embodiment may include the auxiliary reprogram device 400. Therefore, although the provision of the supply voltage VS from the host 20 to the SSD device 10 is stopped or the SSD device is not powered, the SSD device 10 may perform periodically at the first period the reprogram operation on the plurality of nonvolatile memory devices 100-1, 100-2, . . . , 100-$k$. For example, the length of the first period may be to the extent that the loss of the data stored in the SSD device 10 is prevented. As such, the SSD device 10 may have an increased data retention performance.

In addition, the auxiliary reprogram device 400 may detect temperature and adjust the first period based on the temperature. For example, since an amount of electrons detrapped from the floating gate 112 to the p-type well 115 increases as temperature increases, a speed of a data loss of the SSD device 10 may increase. Therefore, the auxiliary reprogram device 400 may decrease the first period when the temperature increases, and increase the first period when the temperature decreases.

Hereinafter, a structure and an operation of the auxiliary reprogram device 400 will be described with reference to FIGS. 7 to 10.

Figure 7:
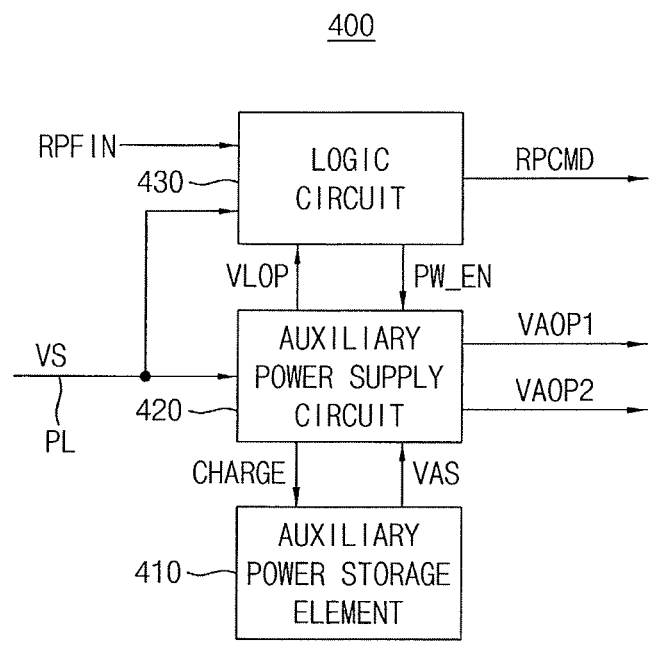
FIG. 7 is a block diagrams illustrating an example of an auxiliary reprogram device included in the SSD device of FIG. 1.

FIG. 7 is a block diagrams illustrating an example of an auxiliary reprogram device included in the SSD device of FIG. 1.

Referring to FIG. 7, the auxiliary reprogram device 400 may include an auxiliary power storage element 410, an auxiliary power supply circuit 420, and a logic circuit 430.

The auxiliary power storage element 410 may store electric power. In an exemplary embodiment, the auxiliary power storage element 410 may include a battery storing electric power. The auxiliary power storage element 410 may generate the auxiliary supply voltage VAS using the stored electric power.

The auxiliary power supply circuit 420 may operate using the auxiliary supply voltage VAS received from the auxiliary power storage element 410. The auxiliary power supply circuit 420 may generate a logic operation voltage VLOP using the auxiliary supply voltage VAS.

In addition, while a power enable signal PW_EN, which is received from the logic circuit 430, is activated, the auxiliary power supply circuit 420 may generate the first auxiliary operation voltage VAOP1 and the second auxiliary operation voltage VAOP2 using the auxiliary supply voltage VAS. As described above, the plurality of nonvolatile memory devices 100-1, 100-2, . . . , 100-$k$ may operate using the first auxiliary operation voltage VAOP1, which is generated by the auxiliary power supply circuit 420, and the controller 200 may operate using the second auxiliary operation voltage VAOP2, which is generated by the auxiliary power supply circuit 420.

While the power enable signal PW_EN, which is received from the logic circuit 430, is deactivated, the auxiliary power supply circuit 420 may stop generating the first auxiliary operation voltage VAOP1 and the second auxiliary operation voltage VAOP2.

In an exemplary embodiment, when the supply voltage VS is provided from the host 20 to the SSD device 10 through the power line PL, the auxiliary power supply circuit 420 may provide charges to the auxiliary power storage element 410 using the supply voltage VS to charge the auxiliary power storage element 410. In this case, the auxiliary power storage element 410 may include a rechargeable battery.

In an exemplary embodiment, the auxiliary power supply circuit 420 may perform a charging operation when the SSD device 10 is powered by the host 20. In the charging operation, the auxiliary power supply circuit 420 charges the auxiliary power storage element 410. When the SSD device 10 is not powered by the host 20, the auxiliary power supply circuit 420 may perform a discharging operation. In the discharging operation, the auxiliary power supply circuit 420 generates the logic operation voltage VLOP, the first auxiliary operation voltage VAOP1, and the second auxiliary operation voltage VAOP2 using the auxiliary supply voltage VAS provided by the auxiliary power storage element 410. For example, the logic operation voltage VLOP and the auxiliary operation voltages VAOP1 and VAOP2 may be generated from the auxiliary supply voltage VAS. In an exemplary embodiment, the logic operation voltage VLOP and the auxiliary operation voltages VAOP1 and VAOP2 may be generated simultaneously. In this case, the auxiliary power supply circuit 420 may be implemented with a bidirectional battery charger.

Figure 8:
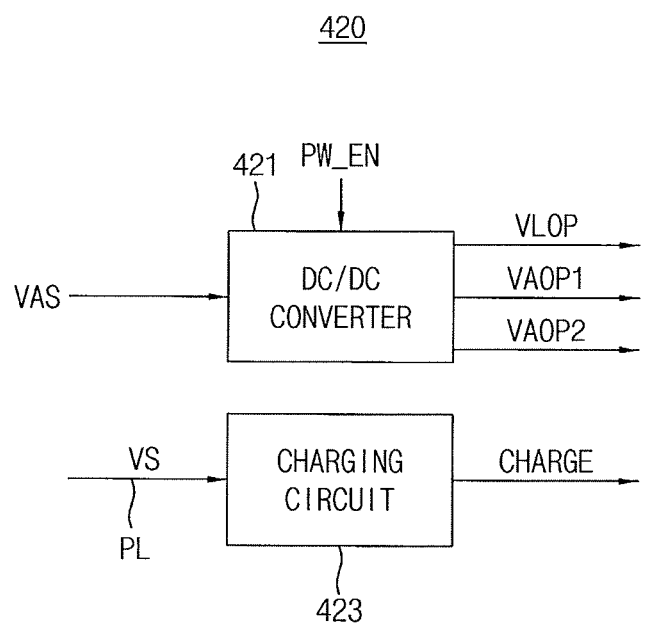
FIG. 8 is a block diagrams illustrating an example of an auxiliary power supply circuit included in the auxiliary reprogram device of FIG. 7.

FIG. 8 is a block diagrams illustrating an example of an auxiliary power supply circuit included in the auxiliary reprogram device of FIG. 7.

Referring to FIG. 8, the auxiliary power supply circuit 420 may include a DC/DC converter 421 and a charging circuit 423.

The DC/DC converter 421 may generate the logic operation voltage VLOP, which is a direct current (DC) voltage, using the auxiliary supply voltage VAS, which is a DC voltage. In addition, the DC/DC converter 421 may generate the first auxiliary operation voltage VAOP1 and the second auxiliary operation voltage VAOP2, which are DC voltages, using the auxiliary supply voltage VAS while the power enable signal PW_EN is activated.

When the supply voltage VS is provided from the host 20 to the SSD device 10 through the power line PL, the charging circuit 423 may charge the auxiliary power storage element 410 by providing charges to the auxiliary power storage element 410 using the supply voltage VS.

In an exemplary embodiment, the charging circuit 423 may operate when the SSD device 10 is powered by the host 10, and the DC/DC converter 421 may be performed when the SSD device 10 is not powered. When the SSD device 10 is not powered, the power enable signal PW_EN is activated so that the DC/DC converter may generate the logic operation voltage VLOP and the auxiliary operation voltages VAOP1 and VAOP2. In an exemplary embodiment, the DC/DC converter 421 and the charging circuit 423 may operate simultaneously.

Referring again to FIG. 7, the logic circuit 430 may operate using the logic operation voltage VLOP, which is provided by the auxiliary power supply circuit 420. The logic circuit 430 may detect a voltage of the power line PL to determine whether the provision of the supply voltage VS through the power line PL is stopped. When the provision of the supply voltage VS through the power line PL is stopped, the logic circuit 430 may activate the power enable signal PW_EN and provide periodically at the first period the reprogram command RPCMD to the controller 200.

When the logic circuit 430 receives the reprogram finish signal RPFIN from the controller 200, the logic circuit 430 may deactivate the power enable signal PW_EN. As described above, when the power enable signal PW_EN is deactivated, the auxiliary power supply circuit 420 may stop generating the first auxiliary operation voltage VAOP1 and the second auxiliary operation voltage VAOP2.

Figure 9:
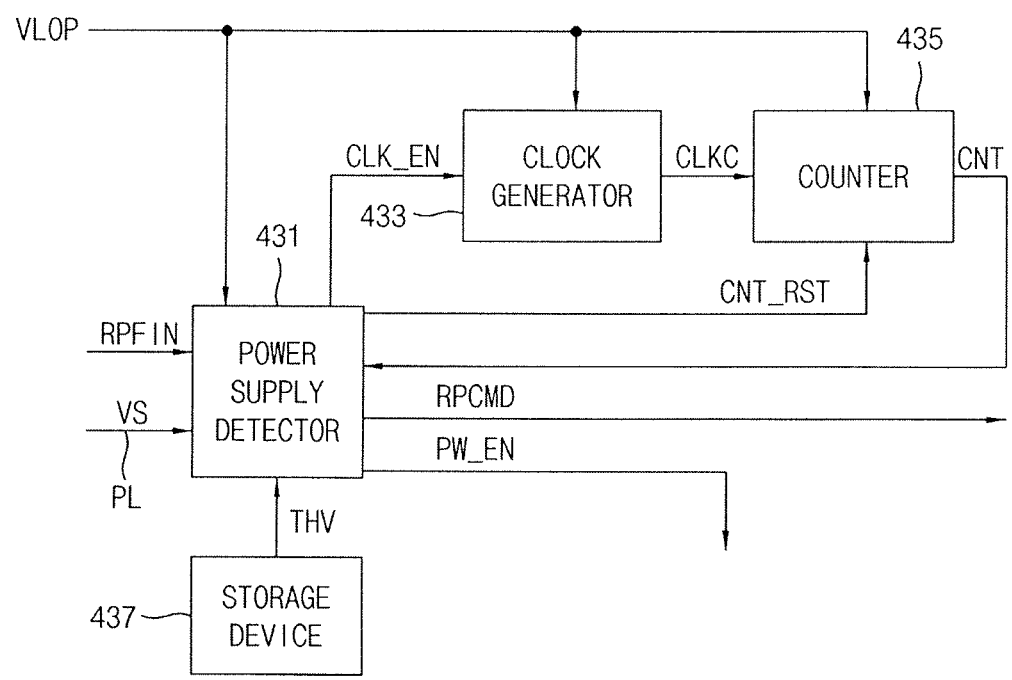
FIG. 9 is a block diagrams illustrating an example of a logic circuit included in the auxiliary reprogram device of FIG. 7.

FIG. 9 is a block diagrams illustrating an example of a logic circuit included in the auxiliary reprogram device of FIG. 7.

Referring to FIG. 9, a logic circuit 430*a* may include a power supply detector 431, a clock generator 433, and a counter 435.

As illustrated in FIG. 9, the power supply detector 431, the clock generator 433, and the counter 435 may operate using the logic operation voltage VLOP provided by the auxiliary power supply circuit 420.

The power supply detector 431 may detect a voltage of the power line PL to determine whether the provision of the supply voltage VS through the power line PL is stopped. When the provision of the supply voltage VS through the power line PL is stopped, the power supply detector 431 may activate a clock enable signal CLK_EN.

The clock generator 433 may generate a count clock signal CLKC while the clock enable signal CLK_EN is activated.

The counter 435 may perform a count operation in synchronization with the count clock signal CLKC to generate a count value CNT. The counter 435 may provide the count value CNT to the power supply detector 431.

The power supply detector 431 may compare the count value CNT with a threshold value THV. When the count value CNT equals to the threshold value THV, the power supply detector 431 may determine that the first period has passed. Therefore, the first period may correspond to a value obtained by multiplying a period of the count clock signal CLKC with the threshold value THV. In this case, the power supply detector 431 may provide the activated power enable signal PW_EN to the auxiliary power supply circuit 420, provide the reprogram command RPCMD to the controller 200, and provide a count reset signal CNT_RST to the counter 435.

The counter 435 may reset the count value CNT in response to the count reset signal CNT_RST. Therefore, when the counter 435 receives the count reset signal CNT_RST, the counter 435 may generate the count value CNT by performing the count operation from an initial value.

As described above, while the power enable signal PW_EN is activated, the auxiliary power supply circuit 420 may provide the first auxiliary operation voltage VAOP1 to the plurality of nonvolatile memory devices 100-1, 100-2, . . . , 100-*k* and provide the second auxiliary operation voltage VAOP2 to the controller 200 using the auxiliary supply voltage VAS. Therefore, the controller 200 may perform the reprogram operation on the plurality of nonvolatile memory devices 100-1, 100-2, . . . , 100-*k* in response to the reprogram command RPCMD.

The controller 200 may provide the reprogram finish signal RPFIN to the power supply detector 431 after finishing the reprogram operation. The power supply detector 431 may deactivate the power enable signal PW_EN in response to the reprogram finish signal RPFIN, and the auxiliary power supply circuit 420 may stop generating the first auxiliary operation voltage VAOP1 and the second auxiliary operation voltage VAOP2 in response to the deactivated power enable signal PW_EN.

When the supply voltage VS is provided again from the host 20 to the SSD device 10 through the power line PL, the power supply detector 431 may deactivate the clock enable signal CLK_EN and provide the count reset signal CNT_RST to the counter 435. Therefore, the clock generator 433 may stop toggling the count clock signal CLKC in response to the deactivated clock enable signal CLK_EN, and the counter 435 may stop performing the count operation and reset the count value CNT.

In an exemplary embodiment, the logic circuit 430*a* may further include a storage device 437 storing the threshold value THV. In an exemplary embodiment, the storage device 437 may include a register storing the threshold value THV received from outside. In an exemplary embodiment, the storage device 437 may include a fuse circuit storing the threshold value THV by fuse cutting.

Referring back to FIGS. 7 to 9, the auxiliary reprogram device 400 may provide the first auxiliary operation voltage VAOP1 to the plurality of nonvolatile memory devices 100-1, 100-2, . . . , 100-*k* and provide periodically at the first period the second auxiliary operation voltage VAOP2 and the reprogram command RPCMD to the controller 200 so that the reprogram operation is performed periodically at the first period on the plurality of nonvolatile memory devices 100-1, 100-2, . . . , 100-*k*. Therefore, the SSD device 10 may have an increased data retention performance. In addition, since the auxiliary reprogram device 400 stops generating the first auxiliary operation voltage VAOP1 and the second auxiliary operation voltage VAOP2 after the reprogram operation is finished, a power consumption of the auxiliary reprogram device 400 may decrease.

Figure 10:
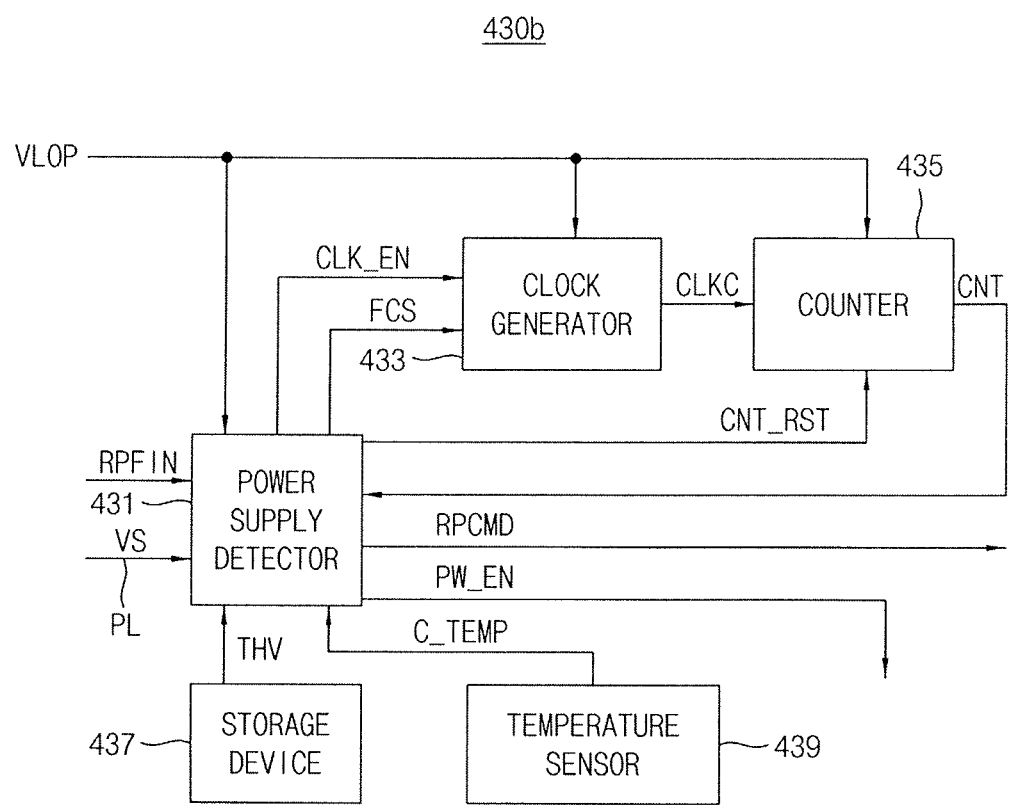
FIG. 10 is a block diagrams illustrating a logic circuit included in the auxiliary reprogram device of FIG. 7 according to an exemplary embodiment of the present inventive concept.

FIG. 10 is a block diagrams illustrating a logic circuit included in the auxiliary reprogram device of FIG. 7 according to an exemplary embodiment of the present inventive concept.

A logic circuit 430*b* of FIG. 10 is the same as the logic circuit 430*a* of FIG. 9 except that the logic circuit 430*b* further includes a temperature sensor 439. Therefore, duplicated description will be omitted and only the differences will be described.

The temperature sensor 439 may detect temperature C_TEMP and provide the temperature C_TEMP to the power supply detector 431.

The power supply detector 431 may generate a frequency control signal FCS based on the temperature C_TEMP, and the clock generator 433 may adjust a frequency of the count clock signal CLKC based on the frequency control signal FCS.

For example, the power supply detector 431 may adjust the frequency control signal FCS such that the frequency of the count clock signal CLKC generated by the clock generator 433 increases as the temperature C_TEMP increases. On the other hand, the power supply detector 431 may adjust the frequency control signal FCS such that the frequency of the count clock signal CLKC generated by the clock generator 433 decreases as the temperature C_TEMP decreases.

As described above with reference to FIG. 9, since the first period corresponds to a value obtained by multiplying the period of the count clock signal CLKC with the threshold value THV, the logic circuit 430b may decrease the first period as the temperature C_TEMP increases, and increase the first period as the temperature C_TEMP decreases.

Therefore, the SSD device 10 including the logic circuit 430b may have an increased data retention performance with less power consumption.

Figure 11:
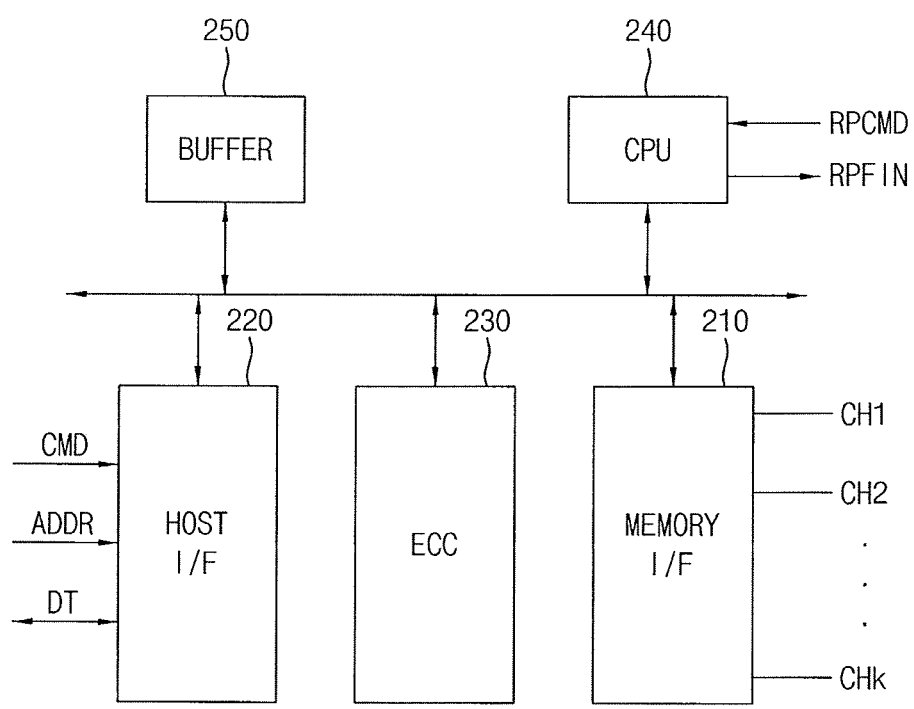
FIG. 11 is a block diagrams illustrating an example of a controller included in the SSD device of FIG. 1.

FIG. 11 is a block diagrams illustrating an example of a controller included in the SSD device of FIG. 1.

Referring to FIG. 11, a controller 200a may include a memory interface 210, a host interface 220, an error correction circuit (ECC) 230, a central processing unit (CPU) 240, and a buffer memory 250.

The memory interface 210 may distribute the data DT received from the buffer memory 250 to the plurality of channels CH1, CH2, . . . , CHk. In addition, the memory interface 210 may deliver the data DT read from the plurality of nonvolatile memory devices 100-1, 100-2, . . . , 100-k to the buffer memory 250.

In an exemplary embodiment, the memory interface 210 may use a flash memory interface method. In this case, the controller 200a may perform the program operation, the read operation, and the erase operation according to the flash memory interface method.

The host interface 220 may be coupled to the host 20 for interfacing the SSD device 10 with the host 20 according to a protocol of the host 20. For example, the host interface 220 may communicate the command signal CMD, the address signal ADDR, and the data DT with the host 20 using various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on. In addition, the host interface 220 may perform disk emulation for supporting the host 20 to recognize the SSD device 10 a hard disk drive (HDD) device.

The buffer memory 250 may temporarily store the data DT provided from the host 20 and the data DT read from the plurality of nonvolatile memory devices 100-1, 100-2, . . . , 100-k. In an exemplary embodiment, the buffer memory 250 may include a volatile memory device, such as a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The error correction circuit 230 may generate an error correction code using the data DT programmed on the plurality of nonvolatile memory devices 100-1, 100-2, . . . , 100-k. The error correction code may be stored in a spare area of the plurality of nonvolatile memory devices 100-1, 100-2, . . . , 100-k. After that, the error correction circuit 230 may detect an error of the data DT read from the plurality of nonvolatile memory devices 100-1, 100-2, . . . , 100-k and correct the detected error using the error correction code.

The CPU 240 may analyze and process the command signal CMD and the address signal ADDR received from the host 20. The CPU 240 may communicate with the host 20 through the host interface 220, and control the plurality of nonvolatile memory devices 100-1, 100-2, . . . , 100-k through the memory interface 210. The CPU 240 may control operations of the plurality of nonvolatile memory devices 100-1, 100-2, . . . , 100-k based on a firmware for driving the SSD device 10.

As described above, when the supply voltage VS is provided from the host 20 to the SSD device 10 through the power line PL, the controller 200a may operate using the second operation voltage VOP2, which is provided by the main power supply circuit 300.

On the other hand, when the provision of the supply voltage VS from the host 20 through the power line PL is stopped, the controller 200a may be turned on only while the second auxiliary operation voltage VAOP2 is provided from the auxiliary reprogram device 400 to perform the reprogram operation on the plurality of nonvolatile memory devices 100-1, 100-2, . . . , 100-k in response to the reprogram command RPCMD received from the auxiliary reprogram device 400.

When the CPU 240 receives the reprogram command RPCMD from the auxiliary reprogram device 400, the CPU 240 may select the reprogram block, which requires the reprogram operation, from among the plurality of blocks included in the plurality of nonvolatile memory devices 100-1, 100-2, . . . , 100-k.

In an exemplary embodiment, when the CPU 240 receives the reprogram command RPCMD from the auxiliary reprogram device 400, the CPU 240 may perform the read operation on at least one page included in each of the plurality of blocks, and determine the number of error bits included in each of the read page data using the error correction circuit 230. The CPU 240 may determine a bit error rate (BER) of each of the read pages based on the number of error bits included in each of the read page data. The CPU 240 may determine a block including a page, which has the bit error rate greater than a reference value, as the reprogram block.

After that, the CPU 240 may perform the reprogram operation on the reprogram block by reading data stored in the reprogram block, programming the read data in another block, and erasing the reprogram block.

After finishing the reprogram operation, the CPU 240 may provide the reprogram finish signal RPFIN to the auxiliary reprogram device 400.

Figure 12:
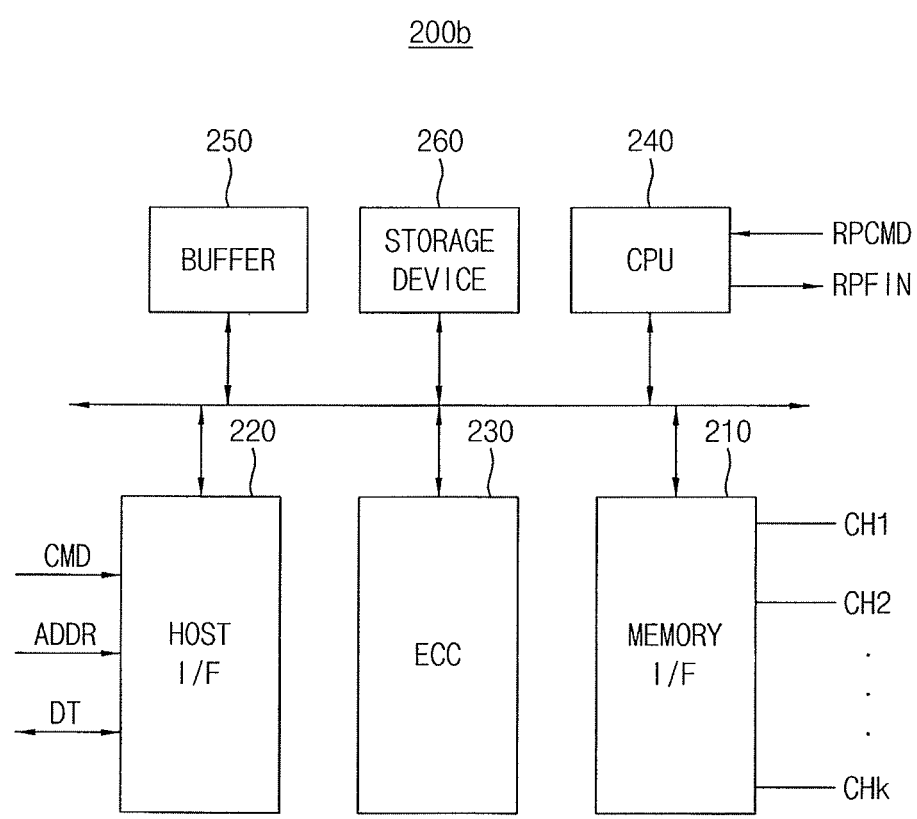
FIG. 12 is a block diagrams illustrating a controller included in the SSD device of FIG. 1 according to an exemplary embodiment of the present inventive concept.

FIG. 12 is a block diagrams illustrating a controller included in the SSD device of FIG. 1 according to an exemplary embodiment of the present inventive concept.

Referring to FIG. 12, a controller 200b may include a memory interface 210, a host interface 220, an error correction circuit (ECC) 230, a central processing unit (CPU) 240, a buffer memory 250, and a storage device 260.

The controller 200b of FIG. 12 is the same as the controller 200a of FIG. 11 except that the controller 200b of FIG. 12 further includes the storage device 260. Therefore, duplicated description will be omitted and only the differences will be described.

When the CPU 240 receives the reprogram command RPCMD from the auxiliary reprogram device 400, the CPU 240 may select the reprogram block, which requires the reprogram operation, from among the plurality of blocks included in the plurality of nonvolatile memory devices 100-1, 100-2, . . . , 100-k.

In an exemplary embodiment, the CPU 240 may store a time, at which the program operation is lastly performed on at least one page included in each of the plurality of blocks, in the storage device 260. When the CPU 240 receives the reprogram command RPCMD from the auxiliary reprogram device 400, the CPU 240 may determine a block including a page, on which the program operation is not performed during more than a reference time, as the reprogram block based on the time stored in the storage device 260.

After that, the CPU 240 may perform the reprogram operation on the reprogram block by reading data stored in the reprogram block, programming the read data in another block, and erasing the reprogram block.

After finishing the reprogram operation, the CPU 240 may provide the reprogram finish signal RPFIN to the auxiliary reprogram device 400.

Figure 13:
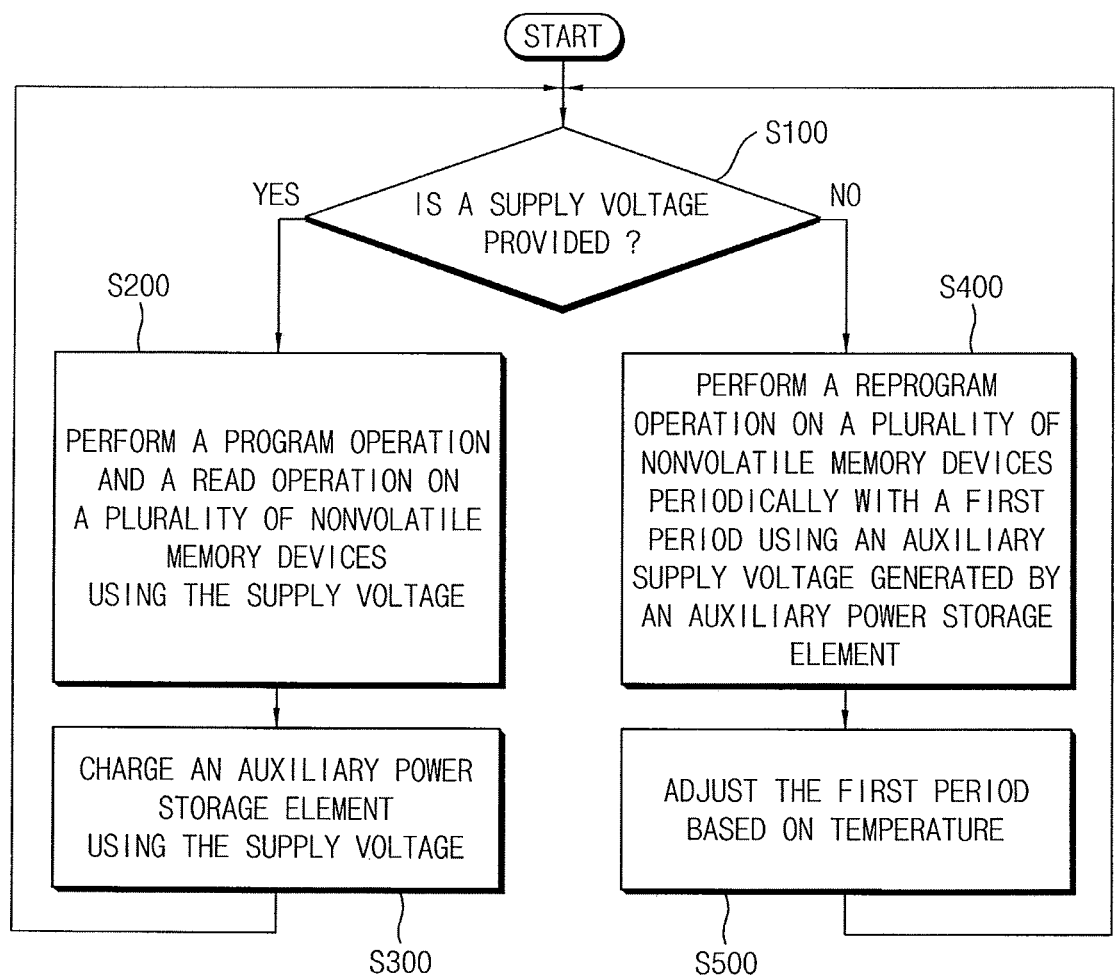
FIG. 13 is a flow chart illustrating a method of operating an SSD device according to an exemplary embodiment of the present inventive concept.

FIG. 13 is a flow chart illustrating a method of operating an SSD device according to an exemplary embodiment of the present inventive concept.

A method of operating an SSD device of FIG. 13 may be performed by the SSD device 10 included in the storage system 1000 of FIG. 1.

Hereinafter, a method of operating the SSD device 10 will be described with reference to FIGS. 1 to 13.

The SSD device 10 may determine whether the supply voltage VS is provided through the power line PL (step S100).

When the supply voltage VS is provided to the SSD device 10 through the power line PL (step S100; yes), the SSD device 10 may perform the program operation and the read operation on the plurality of nonvolatile memory devices 100-1, 100-2, . . . , 100-k using the supply voltage VS (step S200).

In an exemplary embodiment, the SSD device 10 may charge the auxiliary power storage element 410, which is included in the SSD device 10, using the supply voltage VS (step S300).

When the provision of the supply voltage VS to the SSD device 10 through the power line PL is stopped (step S100; no), the SSD device 10 may perform periodically at the first period the reprogram operation on the plurality of nonvolatile memory devices 100-1, 100-2, . . . , 100-k using the auxiliary supply voltage VAS generated by the auxiliary power storage element 410 (step S400).

In an exemplary embodiment, the SSD device 10 may adjust the first period based on the temperature C_TEMP (step S500). For example, the SSD device 10 may decrease the first period when the temperature C_TEMP increases, and increase the first period when the temperature C_TEMP decreases.

Figure 14:
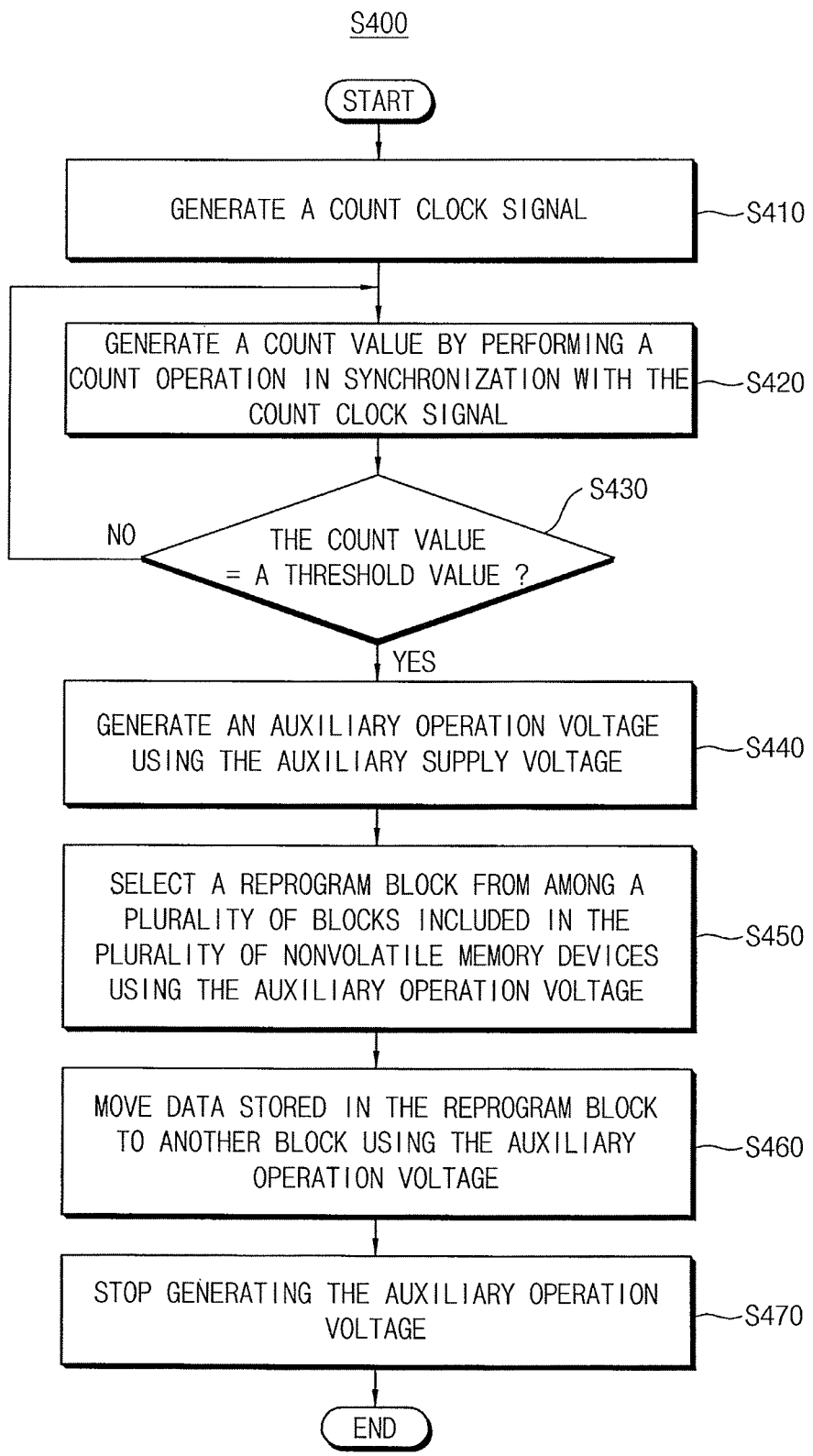
FIG. 14 is a flow chart illustrating an example of a process of performing a reprogram operation on a plurality of nonvolatile memory devices of FIG. 13.

FIG. 14 is a flow chart illustrating an example of a process of performing a reprogram operation on a plurality of nonvolatile memory devices (step S400) of FIG. 13.

Referring to FIG. 14, when the provision of the supply voltage VS to the SSD device 10 through the power line PL is stopped (step S100; no), the SSD device 10 may generate the count clock signal CLKC (step S410), generate the count value CNT by performing a count operation in synchronization with the count clock signal CLKC (step S420), and compare the count value CNT with the threshold value THV (step S430).

When the count value CNT is smaller than the threshold value THV (step S430; no), the SSD device 10 may repeat generating the count value CNT by performing a count operation in synchronization with the count clock signal CLKC (step S420).

When the count value CNT equals to the threshold value THV (step S430; yes), the SSD device 10 may generate the first auxiliary operation voltage VAOP1 and the second auxiliary operation voltage VAOP2 using the auxiliary supply voltage VAS (step S440).

The SSD device 10 may select the reprogram block, which requires the reprogram operation, from among the plurality of blocks included in the plurality of nonvolatile memory devices 100-1, 100-2, . . . , 100-k (step S450) and move data stored in the reprogram block to another block (step S460) using the first auxiliary operation voltage VAOP1 and the second auxiliary operation voltage VAOP2.

After that, the SSD device 10 may stop generating the first auxiliary operation voltage VAOP1 and the second auxiliary operation voltage VAOP2 (step S470).

A structure and an operation of the SSD device 10 included in the storage system 1000 of FIG. 1 are described above with reference to FIGS. 1 to 12. Therefore, detailed description of the steps of FIGS. 13 and 14 will be omitted here.

Figure 15:
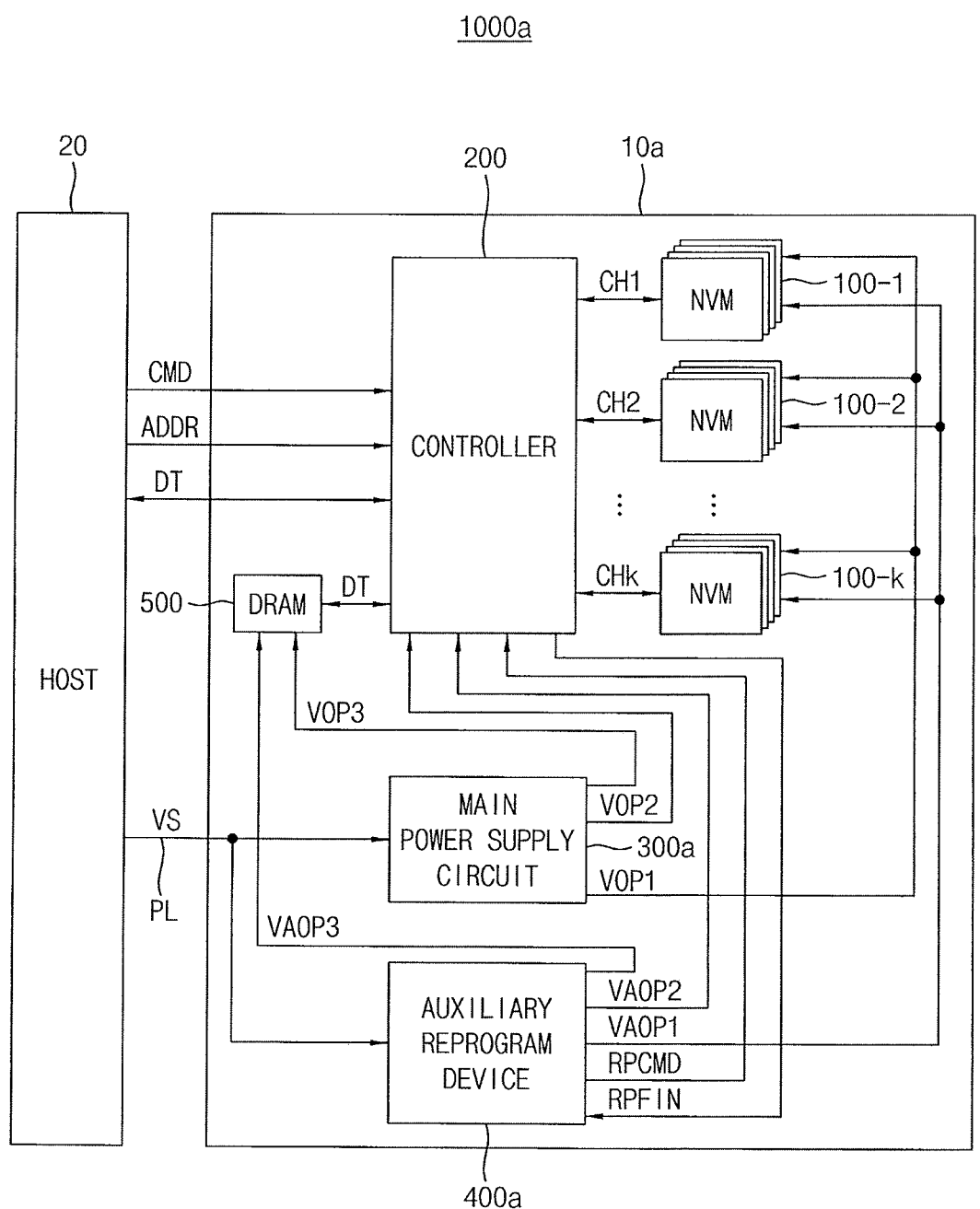
FIG. 15 is a block diagram illustrating a storage system according to an exemplary embodiment of the present inventive concept.

FIG. 15 is a block diagram illustrating a storage system according to an exemplary embodiment of the present inventive concept.

Referring to FIG. 15, a storage system 1000a includes an SSD device 10a and a host 20.

The SSD device 10a may include a plurality of nonvolatile memory devices NVM 100-1, 100-2, . . . , 100-k, a controller 200, a main power supply circuit 300a, an auxiliary reprogram device 400a, and a volatile memory device 500.

The SSD device 10a included in the storage system 1000a of FIG. 15 is the same as the SSD device 10 included in the storage system 1000 of FIG. 1 except that the SSD device 10a included in the storage system 1000a of FIG. 15 further includes the volatile memory device 500. Therefore, duplicated description will be omitted and only the differences will be described.

The volatile memory device 500 may operate as an input/output buffer for the controller 200. For example, in a program mode, the controller 200 may store data DT received from the host 20 in the volatile memory device 500, and program the data DT stored in the volatile memory device 500 in the plurality of nonvolatile memory devices NVM 100-1, 100-2, . . . , 100-k. In a read mode, the controller 200 may store data DT read from the plurality of nonvolatile memory devices NVM 100-1, 100-2, . . . , 100-k in the volatile memory device 500, and provide the data DT stored in the volatile memory device 500 to the host 20.

In an exemplary embodiment, the volatile memory device 500 may include a DRAM.

The main power supply circuit 300a may receive the supply voltage VS from the host 20 through the power line PL.

When the supply voltage VS is provided from the host 20 through the power line PL, the main power supply circuit 300a may generate a first operation voltage VOP1, which is required for an operation of the plurality of nonvolatile memory devices 100-1, 100-2, . . . , 100-k, a second operation voltage VOP2, which is required for an operation of the controller 200, and a third operation voltage VOP3, which is required for an operation of the volatile memory device 500, using the supply voltage VS. For example, the first operation voltage VOP1 may include a plurality of voltages required for operating the plurality of nonvolatile memory devices 100-1, 100-2, . . . , 100-k. For example, the second operation voltage VOP2 may include a plurality of voltages required for operating the controller 200. For example, the third operation voltage VOP3 may include a plurality of voltages required for operating the volatile memory device 500. In this case, the plurality of nonvolatile memory devices 100-1, 100-2, . . . , 100-k may operate using the first operation voltage VOP1, the controller 200 may operate using the second operation voltage VOP2, and the volatile memory device 500 may operate using the third operation voltage VOP3.

On the other hand, when the provision of the supply voltage VS from the host 20 through the power line PL is stopped, the main power supply circuit 300a may be turned off without generating the first operation voltage VOP1, the second operation voltage VOP2, and the third operation voltage VOP3. In this case, the plurality of nonvolatile memory devices 100-1, 100-2, . . . , 100-k, the controller 200, and the volatile memory device 500 may be also turned off.

The auxiliary reprogram device 400a may include the auxiliary power storage element generating the auxiliary supply voltage. Therefore, the auxiliary reprogram device 400a may operate using the auxiliary supply voltage.

The auxiliary reprogram device 400a may be coupled to the power line PL. The auxiliary reprogram device 400a may monitor whether the supply voltage VS is provided from the host 20 through the power line PL. When the provision of the supply voltage VS from the host 20 through the power line PL is stopped, the auxiliary reprogram device 400a may control the controller 200 using the auxiliary supply voltage to perform periodically at the first period the reprogram operation on the plurality of nonvolatile memory devices 100-1, 100-2, . . . , 100-k.

For example, when the provision of the supply voltage VS from the host 20 through the power line PL is stopped, the auxiliary reprogram device 400a may generate a first auxiliary operation voltage VAOP1, which is required for an operation of the plurality of nonvolatile memory devices 100-1, 100-2, . . . , 100-k, a second auxiliary operation voltage VAOP2, which is required for an operation of the controller 200, and a third auxiliary operation voltage VAOP3, which is required for an operation of the volatile memory device 500, using the auxiliary supply voltage. For example, the first auxiliary operation voltage VAOP1 may include a plurality of voltages required for operating the plurality of nonvolatile memory devices 100-1, 100-2, . . . , 100-k. For example, the second auxiliary operation voltage VAOP2 may include a plurality of voltages required for operating the controller 200. For example, the third auxiliary operation voltage VAOP3 may include a plurality of voltages required for operating the volatile memory device 500. In this case, the plurality of nonvolatile memory devices 100-1, 100-2, . . . , 100-k may operate using the first auxiliary operation voltage VAOP1, the controller 200 may operate using the second auxiliary operation voltage VAOP2, and the volatile memory device 500 may operate using the third auxiliary operation voltage VAOP3. In addition, the auxiliary reprogram device 400a may provide the reprogram command RPCMD to the controller 200. The controller 200 may perform the reprogram operation on the plurality of nonvolatile memory devices 100-1, 100-2, . . . , 100-k in response to the reprogram command RPCMD, and provide the reprogram finish signal RPFIN to the auxiliary reprogram device 400a after finishing the reprogram operation. The auxiliary reprogram device 400a may stop generating the first auxiliary operation voltage VAOP1, the second auxiliary operation voltage VAOP2, and the third auxiliary operation voltage VAOP3 in response to the reprogram finish signal RPFIN.

In an exemplary embodiment, the first auxiliary operation voltage VAOP1, the second auxiliary operation voltage VAOP2, and the third auxiliary operation voltage VAOP3, which are generated by the auxiliary reprogram device 400a, may be substantially the same as the first operation voltage VOP1, the second operation voltage VOP2, and the third operation voltage VOP3, which are generated by the main power supply circuit 300a.

Figure 16:
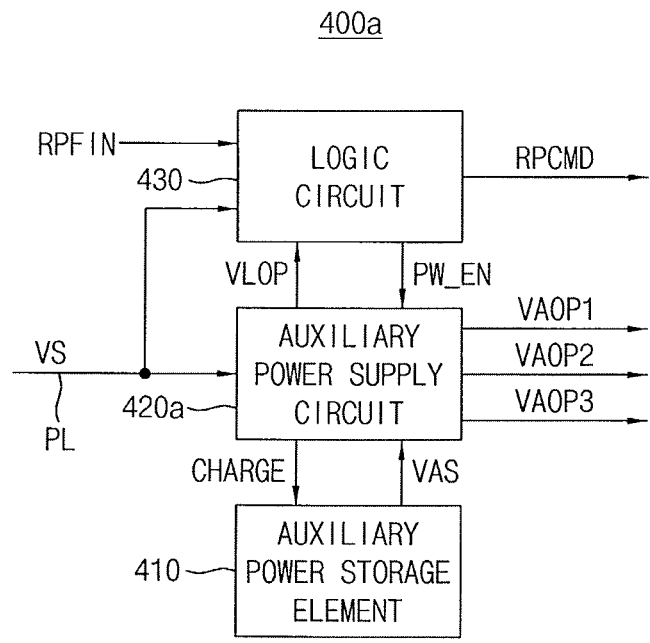
FIG. 16 is a block diagrams illustrating an example of an auxiliary reprogram device included in the SSD device of FIG. 15.

FIG. 16 is a block diagrams illustrating an example of an auxiliary reprogram device included in the SSD device of FIG. 15.

Referring to FIG. 16, the auxiliary reprogram device 400a may include an auxiliary power storage element 410, an auxiliary power supply circuit 420a, and a logic circuit 430.

The auxiliary reprogram device 400a of FIG. 16 is the same as the auxiliary reprogram device 400 of FIG. 7 except that the auxiliary power supply circuit 420a included in the auxiliary reprogram device 400a of FIG. 16 further generates the third auxiliary operation voltage VAOP3. Therefore, duplicated description will be omitted.

The auxiliary power supply circuit 420a may operate using the auxiliary supply voltage VAS received from the auxiliary power storage element 410. The auxiliary power supply circuit 420a may generate the logic operation voltage VLOP using the auxiliary supply voltage VAS.

In addition, while the power enable signal PW_EN, which is received from the logic circuit 430, is activated, the auxiliary power supply circuit 420a may generate the first auxiliary operation voltage VAOP1, the second auxiliary operation voltage VAOP2, and the third auxiliary operation voltage VAOP3 using the auxiliary supply voltage VAS. As described above, the plurality of nonvolatile memory devices 100-1, 100-2, . . . , 100-k may operate using the first auxiliary operation voltage VAOP1, which is generated by the auxiliary power supply circuit 420a, the controller 200 may operate using the second auxiliary operation voltage VAOP2, which is generated by the auxiliary power supply circuit 420a, and the volatile memory device 500 may operate using the third auxiliary operation voltage VAOP3, which is generated by the auxiliary power supply circuit 420a.

While the power enable signal PW_EN, which is received from the logic circuit 430, is deactivated, the auxiliary power supply circuit 420a may stop generating the first auxiliary operation voltage VAOP1, the second auxiliary operation voltage VAOP2, and the third auxiliary operation voltage VAOP3.

In an exemplary embodiment, when the supply voltage VS is provided from the host 20 to the SSD device 10a through the power line PL, the auxiliary power supply circuit 420a may provide charges to the auxiliary power storage element 410 using the supply voltage VS to charge the auxiliary power storage element 410. In this case, the auxiliary power storage element 410 may include a rechargeable battery.

In an exemplary embodiment, the auxiliary power supply circuit 420a may perform a charging operation when the SSD device 10a is powered. In the charging operation, the auxiliary power supply circuit 420a charges the auxiliary power storage element 410. The auxiliary power supply circuit 420a may perform a discharging operation when the SSD device 10a is not powered. In the discharging operation, the auxiliary power supply circuit 420a generates the logic operation voltage VLOP, the first auxiliary operation voltage VAOP1, the second auxiliary operation voltage VAOP2, and the third auxiliary operation voltage VAOP3 using the auxiliary supply voltage VAS provided by the auxiliary power storage element 410. For example, the logic operation voltage VLOP and the auxiliary operation voltages VAOP1 and VAOP2 may be generated from the auxiliary supply voltage VAS. In an exemplary embodiment, the logic operation voltage VLOP and the auxiliary operation voltages VAOP1 and VAOP2 may be generated simultaneously. In this case, the auxiliary power supply circuit 420a may be implemented with a bidirectional battery charger.

Figure 17:
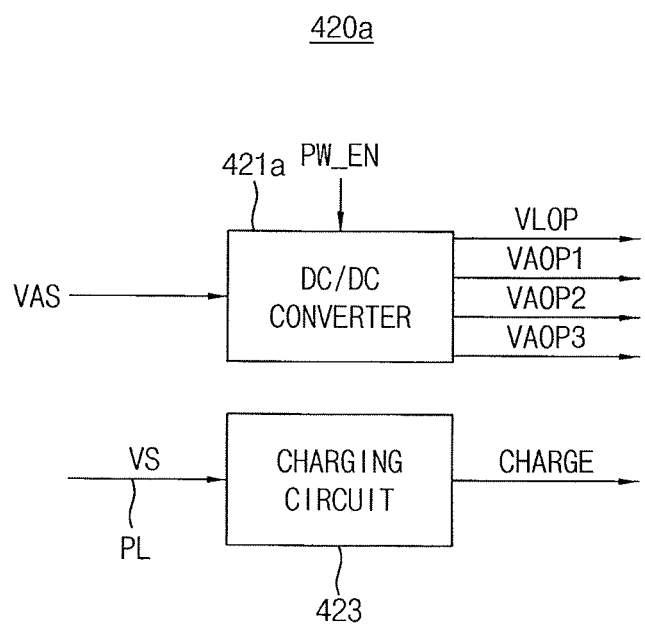
FIG. 17 is a block diagrams illustrating an example of an auxiliary power supply circuit included in the auxiliary reprogram device of FIG. 16.

FIG. 17 is a block diagrams illustrating an example of an auxiliary power supply circuit included in the auxiliary reprogram device of FIG. 16.

Referring to FIG. 17, the auxiliary power supply circuit 420a may include a DC/DC converter 421a and a charging circuit 423.

The DC/DC converter 421a may generate the logic operation voltage VLOP, which is a DC voltage, using the auxiliary supply voltage VAS, which is a DC voltage. In addition, the DC/DC converter 421a may generate the first auxiliary operation voltage VAOP1, the second auxiliary operation voltage VAOP2, and the third auxiliary operation voltage VAOP3, which are DC voltages, using the auxiliary supply voltage VAS while the power enable signal PW_EN is activated.

When the supply voltage VS is provided from the host 20 to the SSD device 10a through the power line PL, the charging circuit 423 may charge the auxiliary power storage element 410 by providing charges to the auxiliary power storage element 410 using the supply voltage VS.

In an exemplary embodiment, the DC/DC converter 421a and the charging circuit 423 may operate simultaneously.

Figure 18:
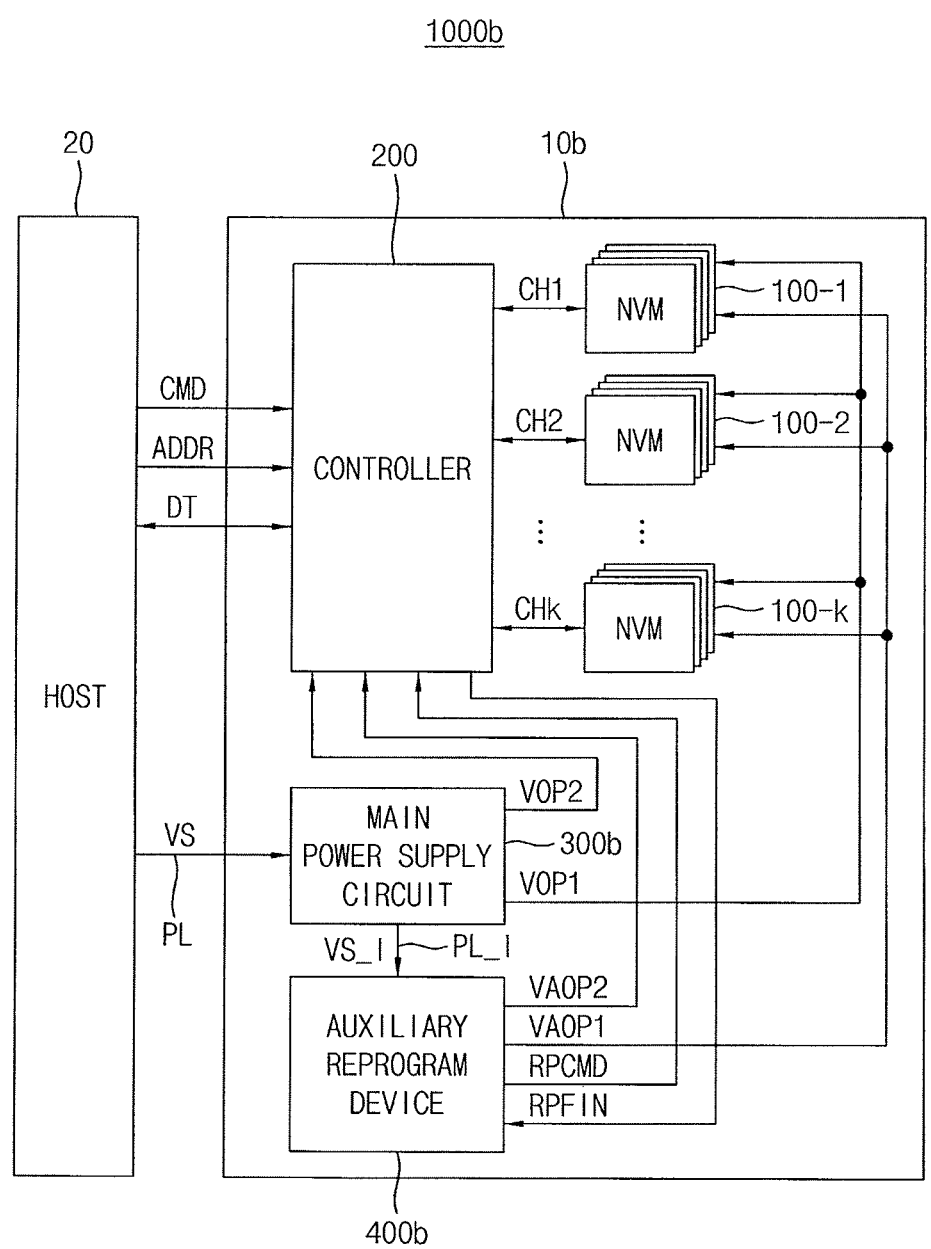
FIG. 18 is a block diagram illustrating a storage system according to an exemplary embodiment of the present inventive concept.

FIG. 18 is a block diagram illustrating a storage system according to an exemplary embodiment of the present inventive concept.

Referring to FIG. 18, a storage system 1000b includes an SSD device 10b and a host 20.

The SSD device 10b may include a plurality of nonvolatile memory devices NVM 100-1, 100-2, . . . , 100-k, a controller 200, a main power supply circuit 300b, and an auxiliary reprogram device 400b.

The SSD device 10b included in the storage system 1000b of FIG. 18 is the same as the SSD device 10 included in the storage system 1000 of FIG. 1 except that operations of the main power supply circuit 300b and the auxiliary reprogram device 400b included in the storage system 1000b of FIG. 18 are different from operations of the main power supply circuit 300 and the auxiliary reprogram device 400 included in the storage system 1000 of FIG. 1. Therefore, duplicated description will be omitted and only the differences will be described.

The main power supply circuit 300b may receive the supply voltage VS from the host 20 through the power line PL.

When the supply voltage VS is provided from the host 20 through the power line PL, the main power supply circuit 300b may generate first operation voltage VOP1, which is required for an operation of the plurality of nonvolatile memory devices 100-1, 100-2, . . . , 100-k, and a second operation voltage VOP2, which is required for an operation of the controller 200, using the supply voltage VS. For example, the first operation voltage VOP1 may include a plurality of voltages required for operating the plurality of nonvolatile memory devices 100-1, 100-2, . . . , 100-k. For example, the second operation voltage VOP2 may include a plurality of voltages required for operating the controller 200. In this case, the plurality of nonvolatile memory devices 100-1, 100-2, . . . , 100-k may operate using the first operation voltage VOP1, and the controller 200 may operate using the second operation voltage VOP2.

In addition, when the supply voltage VS is provided from the host 20 through the power line PL, the main power supply circuit 300b may provide an internal supply voltage VS_I to the auxiliary reprogram device 400b through an internal power line PL_I using the supply voltage VS. In an exemplary embodiment, the main power supply circuit 300b may bypass the supply voltage VS to the auxiliary reprogram device 400b through the internal power line PL_I as the internal supply voltage VS_I. In an exemplary embodiment, the main power supply circuit 300b may change a magnitude of the supply voltage VS and provide the changed voltage to the auxiliary reprogram device 400b through an internal power line PL_I as the internal supply voltage VS_I.

On the other hand, when the provision of the supply voltage VS from the host 20 through the power line PL is stopped, the main power supply circuit 300b may be turned off without generating the first operation voltage VOP1 and the second operation voltage VOP2. In this case, the plurality of nonvolatile memory devices 100-1, 100-2, . . . , 100-k and the controller 200 may be also turned off.

In addition, when the provision of the supply voltage VS from the host 20 through the power line PL is stopped, the main power supply circuit 300b may stop providing the internal supply voltage VS_I to the auxiliary reprogram device 400b.

The auxiliary reprogram device 400b may include the auxiliary power storage element generating the auxiliary supply voltage. Therefore, the auxiliary reprogram device 400b may operate using the auxiliary supply voltage.

The auxiliary reprogram device 400b may be coupled to the main power supply circuit 300b through the internal power line PL_I. The auxiliary reprogram device 400b may monitor whether the internal supply voltage VS_I is provided from the main power supply circuit 300b through the internal power line PL_I. When the provision of the internal supply voltage VS_I from the main power supply circuit 300b through the internal power line PL_I is stopped, the auxiliary reprogram device 400b may control the controller 200 using the auxiliary supply voltage to perform periodically at the first period the reprogram operation on the plurality of nonvolatile memory devices 100-1, 100-2, . . . , 100-k.

For example, when the provision of the internal supply voltage VS_I from the main power supply circuit 300b through the internal power line PL_I is stopped, the auxiliary reprogram device 400b may generate a first auxiliary operation voltage VAOP1, which is required for an operation of the plurality of nonvolatile memory devices 100-1, 100-2, . . . , 100-k, and a second auxiliary operation voltage VAOP2, which is required for an operation of the controller 200, using the auxiliary supply voltage. In this case, the plurality of nonvolatile memory devices 100-1, 100-2, . . . , 100-k may operate using the first auxiliary operation voltage VAOP1, and the controller 200 may operate using the second auxiliary operation voltage VAOP2. In addition, the auxiliary reprogram device 400b may provide the reprogram command RPCMD to the controller 200. The controller 200 may perform the reprogram operation on the plurality of nonvolatile memory devices 100-1, 100-2, . . . , 100-k in response to the reprogram command RPCMD, and provide the reprogram finish signal RPFIN to the auxiliary reprogram device 400b after finishing the reprogram operation. The auxiliary reprogram device 400b may stop generating the first auxiliary operation voltage VAOP1 and the second auxiliary operation voltage VAOP2 in response to the reprogram finish signal RPFIN.

In an exemplary embodiment, the first auxiliary operation voltage VAOP1 and the second auxiliary operation voltage VAOP2, which are generated by the auxiliary reprogram device 400b, may be substantially the same as the first operation voltage VOP1 and the second operation voltage VOP2, which are generated by the main power supply circuit 300b.

The auxiliary reprogram device 400b included in the SSD device 10b of FIG. 18 is the same as the auxiliary reprogram device 400 included in the SSD device 10 of FIG. 1 except that the auxiliary reprogram device 400b operates based on the internal supply voltage VS_I provided through the internal power line PL_I while the auxiliary reprogram device 400 operates based on the supply voltage VS provided through the power line PL. Therefore, duplicated description about the auxiliary reprogram device 400b will be omitted here.

Figure 19:
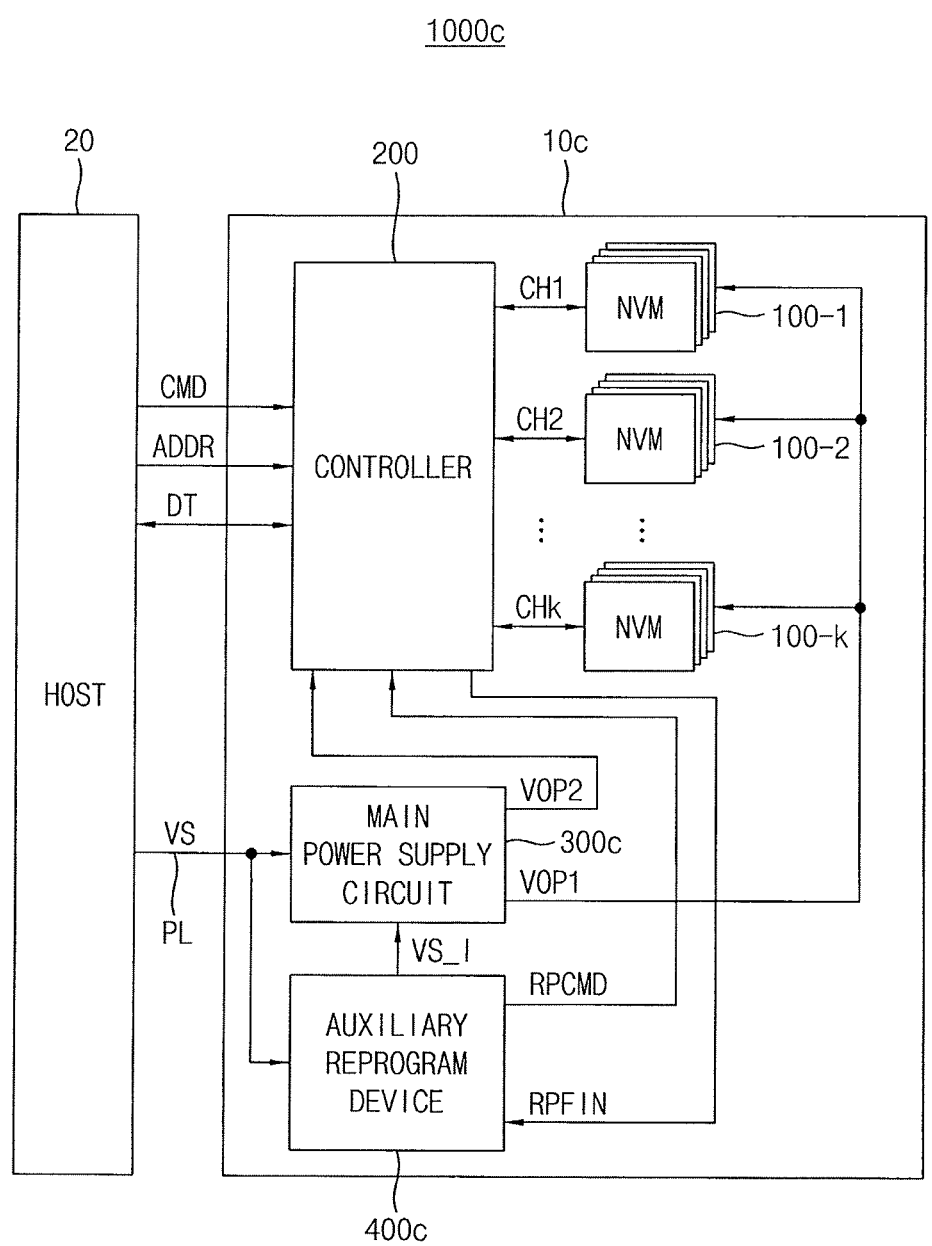
FIG. 19 is a block diagram illustrating a storage system according to an exemplary embodiment of the present inventive concept.

FIG. 19 is a block diagram illustrating a storage system according to an exemplary embodiment of the present inventive concept.

Referring to FIG. 19, a storage system 1000c includes an SSD device 10c and a host 20.

The SSD device 10c may include a plurality of nonvolatile memory devices NVM 100-1, 100-2, . . . , 100-k, a controller 200, a main power supply circuit 300c, and an auxiliary reprogram device 400c.

The SSD device 10c included in the storage system 1000c of FIG. 19 is the same as the SSD device 10 included in the storage system 1000 of FIG. 1 except that operations of the main power supply circuit 300c and the auxiliary reprogram device 400c included in the storage system 1000c of FIG. 19 are different from operations of the main power supply circuit 300 and the auxiliary reprogram device 400 included in the storage system 1000 of FIG. 1. Therefore, duplicated description will be omitted and only the differences will be described.

The main power supply circuit 300c may receive the supply voltage VS from the host 20 through the power line PL.

When the supply voltage VS is provided from the host 20 through the power line PL, the main power supply circuit 300c may generate first operation voltage VOP1, which is required for an operation of the plurality of nonvolatile memory devices 100-1, 100-2, . . . , 100-k, and a second operation voltage VOP2, which is required for an operation of the controller 200, using the supply voltage VS. For example, the first operation voltage VOP1 may include a plurality of voltages required for operating the plurality of nonvolatile memory devices 100-1, 100-2, . . . , 100-k. For example, the second operation voltage VOP2 may include a plurality of voltages required for operating the controller 200.

In addition, when an internal supply voltage VS_I is provided from the auxiliary reprogram device 400c, the main power supply circuit 300c may generate a first operation voltage VOP1, which is required for an operation of the plurality of nonvolatile memory devices 100-1, 100-2, . . . , 100-k, and a second operation voltage VOP2, which is required for an operation of the controller 200, using the internal supply voltage VS_I. For example, the first operation voltage VOP1 may include a plurality of voltages required for operating the plurality of nonvolatile memory devices 100-1, 100-2, . . . , 100-k. For example, the second operation voltage VOP2 may include a plurality of voltages required for operating the controller 200.

When the plurality of nonvolatile memory devices 100-1, 100-2, . . . , 100-k receives the first operation voltage VOP1 from the main power supply circuit 300c, the plurality of nonvolatile memory devices 100-1, 100-2, . . . , 100-k may operate using the first operation voltage VOP1. When the plurality of nonvolatile memory devices 100-1, 100-2, . . . , 100-k does not receive the first operation voltage VOP1 from the main power supply circuit 300c, the plurality of nonvolatile memory devices 100-1, 100-2, . . . , 100-k may be turned off.

When the controller 200 receives the second operation voltage VOP2 from the main power supply circuit 300c, the controller 200 may operate using the second operation voltage VOP2. When the controller 200 does not receive the second operation voltage VOP2 from the main power supply circuit 300c, the controller 200 may be turned off.

The auxiliary reprogram device 400c may include the auxiliary power storage element generating the auxiliary supply voltage. Therefore, the auxiliary reprogram device 400c may operate using the auxiliary supply voltage.

The auxiliary reprogram device 400c may be coupled to the power line PL. The auxiliary reprogram device 400c may monitor whether the supply voltage VS is provided from the host 20 through the power line PL. When the provision of the supply voltage VS from the host 20 through the power line PL is stopped, the auxiliary reprogram device 400c may control the controller 200 using the auxiliary supply voltage to perform periodically at the first period the reprogram operation on the plurality of nonvolatile memory devices 100-1, 100-2, . . . , 100-k.

For example, when the provision of the supply voltage VS from the host 20 through the power line PL is stopped, the auxiliary reprogram device 400c may generate the internal supply voltage VS_I using the auxiliary supply voltage and provide the internal supply voltage VS_I to the main power supply circuit 300c. In this case, as described above, the main power supply circuit 300c may generate the first operation voltage VOP1 and the second operation voltage VOP2 using the internal supply voltage VS_I. In addition, the auxiliary reprogram device 400c may provide the reprogram command RPCMD to the controller 200. The controller 200 may perform the reprogram operation on the plurality of nonvolatile memory devices 100-1, 100-2, . . . , 100-k in response to the reprogram command RPCMD, and provide the reprogram finish signal RPFIN to the auxiliary reprogram device 400c after finishing the reprogram operation. The auxiliary reprogram device 400c may stop generating the internal supply voltage VS_I in response to the reprogram finish signal RPFIN. In this case, the main power supply circuit 300c may be turned off without generating the first operation voltage VOP1 and the second operation voltage VOP2.

Figure 20:
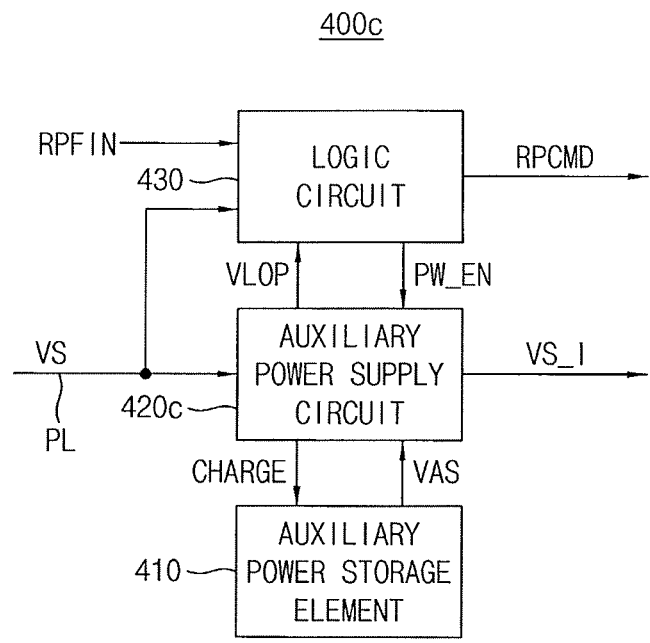
FIG. 20 is a block diagrams illustrating an example of an auxiliary reprogram device included in the SSD device of FIG. 19.

FIG. 20 is a block diagrams illustrating an example of an auxiliary reprogram device included in the SSD device of FIG. 19.

Referring to FIG. 20, the auxiliary reprogram device 400c may include an auxiliary power storage element 410, an auxiliary power supply circuit 420c, and a logic circuit 430.

The auxiliary reprogram device 400c of FIG. 20 is the same as the auxiliary reprogram device 400 of FIG. 7 except for an operation of the auxiliary power supply circuit 420c included in the auxiliary reprogram device 400c of FIG. 20. Therefore, duplicated description will be omitted.

The auxiliary power supply circuit 420c may operate using the auxiliary supply voltage VAS received from the auxiliary power storage element 410. The auxiliary power supply circuit 420c may generate the logic operation voltage VLOP using the auxiliary supply voltage VAS.

In addition, while the power enable signal PW_EN, which is received from the logic circuit 430, is activated, the auxiliary power supply circuit 420c may generate the internal supply voltage VS_I using the auxiliary supply voltage VAS. In this case, as described above, the main power supply circuit 300c may generate the first operation voltage VOP1 and the second operation voltage VOP2 using the internal supply voltage VS_I.

While the power enable signal PW_EN, which is received from the logic circuit 430, is deactivated, the auxiliary power supply circuit 420 may stop generating the internal supply voltage VS_I. In this case, the main power supply circuit 300c may be turned off without generating the first operation voltage VOP1 and the second operation voltage VOP2.

In an exemplary embodiment, when the supply voltage VS is provided from the host 20 to the SSD device 10c through the power line PL, the auxiliary power supply circuit 420c may provide charges to the auxiliary power storage element 410 using the supply voltage VS to charge the auxiliary power storage element 410. In this case, the auxiliary power storage element 410 may include a rechargeable battery.

In an exemplary embodiment, the auxiliary power supply circuit 420c may perform a charging operation, in which the auxiliary power supply circuit 420c charges the auxiliary power storage element 410, and a discharging operation, in which the auxiliary power supply circuit 420c generates the logic operation voltage VLOP and the internal supply voltage VS_I using the auxiliary supply voltage VAS provided by the auxiliary power storage element 410, simultaneously. In this case, the auxiliary power supply circuit 420c may be implemented with a bidirectional battery charger.

Figure 21:
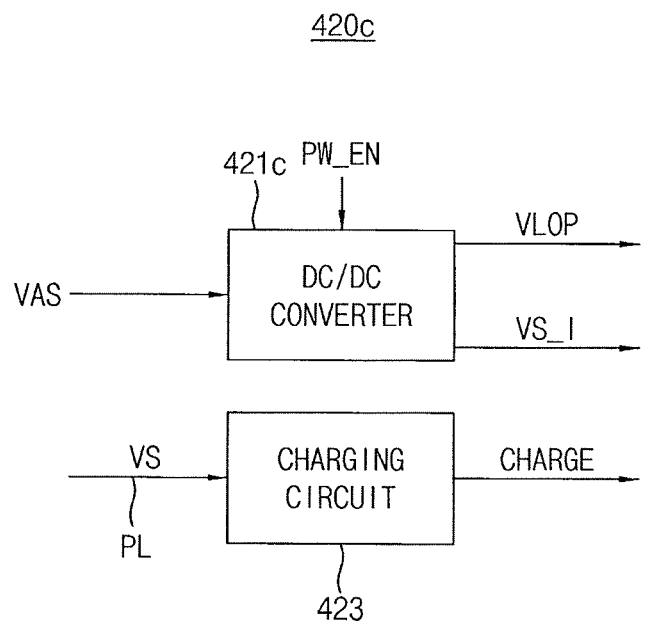
FIG. 21 is a block diagrams illustrating an example of an auxiliary power supply circuit included in the auxiliary reprogram device of FIG. 20.

FIG. 21 is a block diagrams illustrating an example of an auxiliary power supply circuit included in the auxiliary reprogram device of FIG. 20.

Referring to FIG. 21, the auxiliary power supply circuit 420c may include a DC/DC converter 421c and a charging circuit 423.

The DC/DC converter 421c may generate the logic operation voltage VLOP, which is a DC voltage, using the auxiliary supply voltage VAS, which is a DC voltage. In addition, the DC/DC converter 421c may generate the internal supply voltage VS_I, which is a DC voltage, using the auxiliary supply voltage VAS while the power enable signal PW_EN is activated.

When the supply voltage VS is provided from the host 20 to the SSD device 10c through the power line PL, the charging circuit 423 may charge the auxiliary power storage element 410 by providing charges to the auxiliary power storage element 410 using the supply voltage VS.

In an exemplary embodiment, the DC/DC converter 421c and the charging circuit 423 may operate simultaneously.

Figure 22:
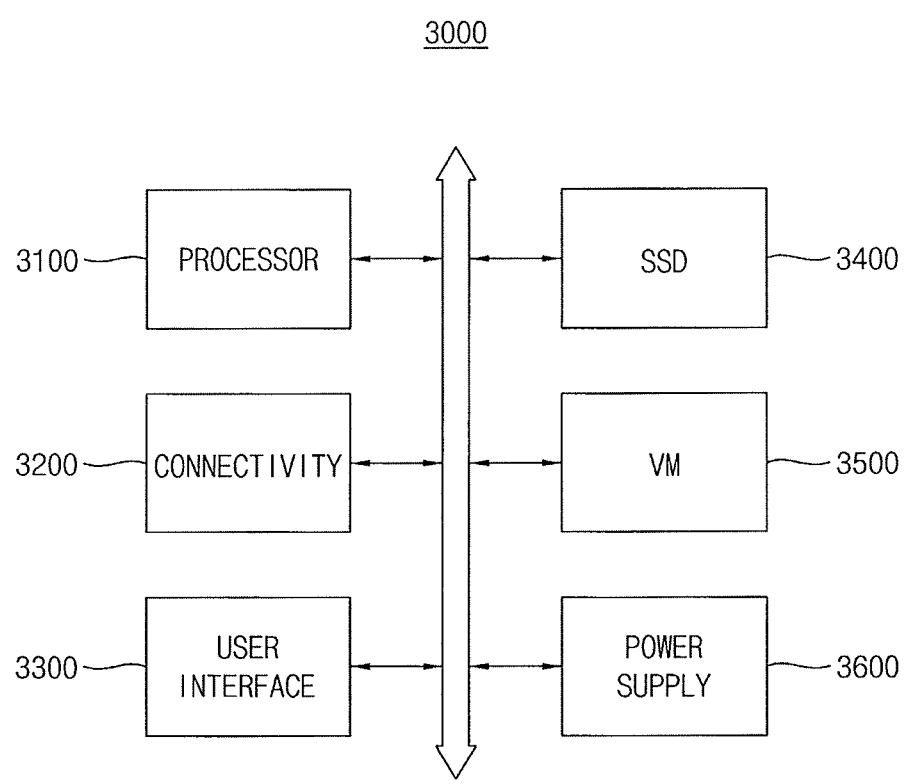
FIG. 22 is a block diagram illustrating a computing system according to an exemplary embodiment of the present inventive concept.

FIG. 22 is a block diagram illustrating a computing system according to an exemplary embodiment of the present inventive concept.

Referring to FIG. 22, a computing system 3000 includes a processor 3100, a connectivity circuit 3200, a user interface 3300, an SSD device 3400, a volatile memory device (VM) 3500, and a power supply 3600.

In an exemplary embodiment, the computing system 3000 may be any kinds of computing systems, such as a desktop computer, a laptop computer, a server computer, etc.

The processor 3100 may execute applications, such as a web browser, a game application, a video player, etc. In an exemplary embodiment, the processor 3100 may include a single core or multiple cores. For example, the processor 3100 may be a multi-core processor, such as a dual-core processor, a quad-core processor, a hexa-core processor, etc. The processor 3100 may include an internal or external cache memory.

The connectivity circuit 3200 may perform wired or wireless communication with an external device. For example, the connectivity circuit 3200 may perform Ethernet communication, near field communication (NFC), radio frequency identification (RFID) communication, mobile telecommunication, memory card communication, universal serial bus (USB) communication, etc. In some embodiments, the connectivity circuit 3200 may include a baseband chipset that supports communications, such as global system for mobile communications (GSM), general packet radio service (GPRS), wideband code division multiple access (WCDMA), high speed downlink/uplink packet access (HS×PA), etc.

The power supply 3600 may provide a supply voltage to the computing system 3000. For example, the power supply 3600 may provide the supply voltage to the SSD device 3400 through a power line.

The SSD device 3400 may store a boot image for booting the computing system 3000.

The SSD device 3400 may be implemented with one of the SSD devices 10, 10a, 10b, and 10c of FIGS. 1, 15, 18, and 19. Structures and operations of the SSD devices 10, 10a, 10b, and 10c of FIGS. 1, 15, 18, and 19 are described above with reference to FIGS. 1 to 21. Therefore, detail description of the SSD device 3400 will be omitted here.

The volatile memory device 3500 may store data processed by the processor 3100, or may operate as a working memory.

The user interface 3300 may include at least one input device, such as a keypad, a touch screen, etc., and at least one output device, such as a speaker, a display device, etc.

In an exemplary embodiment, the computing system 3000 may further include an image processor, and/or a storage device, such as a memory card, a hard disk drive (HDD), a CD-ROM, etc.

In an exemplary embodiment, the computing system 3000 and/or components of the computing system 3000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:
1. A solid state drive (SSD) device, comprising:
a plurality of nonvolatile memory devices;
a controller configured to control the plurality of nonvolatile memory devices;

a main power supply circuit configured to provide an operation voltage to the plurality of nonvolatile memory devices and the controller using a supply voltage provided through a power line; and an auxiliary reprogram device configured to provide an auxiliary supply voltage to the plurality of nonvolatile memory devices and the controller, generate a reprogram command, and output the reprogram command to the controller when provision of the supply voltage through the power line is stopped for a predetermined time, wherein the controller is configured to perform a reprogram operation on the plurality of nonvolatile memory devices in response to the reprogram command and provide a reprogram finish signal to the auxiliary reprogram device after finishing the reprogram operation, and wherein the auxiliary reprogram device stops generating the auxiliary supply voltage after the reprogram operation has completed in response to receipt of the reprogram finish signal.

2. The SSD device of claim 1, wherein the auxiliary reprogram device includes a temperature sensor, wherein the auxiliary reprogram device outputs the reprogram command to the controller periodically every first period, and adjusts the first period based on a temperature detected by the temperature sensor.

3. The SSD device of claim 1, wherein the auxiliary reprogram device includes:

an auxiliary power storage element configured to generate the auxiliary supply voltage;

an auxiliary power supply circuit configured to receive the auxiliary supply voltage and generate a logic operation voltage and an auxiliary operation voltage using the auxiliary supply voltage while a power enable signal is activated; and a logic circuit configured to determine whether the supply voltage is being provided through the power line, wherein the logic circuit activates the power enable signal and provides the reprogram command periodically every first period to the controller when the logic circuit determines the supply voltage has stopped being provided through the power line.

4. The SSD device of claim 3, wherein the logic circuit includes:

a power supply detector configured to detect whether the supply voltage is supplied through the power line to the SSD and to generate a clock enable signal when it detects that the supply voltage is supplied through the power line;

a clock generator configured to generate, in response to the clock enable signal, a count clock signal; and a counter configured to perform a count operation in synchronization with the count clock signal to generate a count value and to reset the count value in response to a count reset signal, wherein the power supply detector receives the count value from the counter and if the count value equals to a threshold value, activates the power enable signal, outputs the reprogram command to the controller, and generates the count reset signal.

5. The SSD device of claim 4, wherein the power supply detector deactivates the clock enable signal when the power supply detector detects that the supply voltage is supplied through the power line, and wherein the clock generator stops, in response to the activation of the clock enable signal, toggling the count clock signal.

6. The SSD device of claim 4, wherein the logic circuit further includes:

a temperature sensor configured to detect temperature, and wherein the power supply detector generates a frequency control signal based on the temperature, and wherein the clock generator adjusts a frequency of the count clock signal based on the frequency control signal.

7. The SSD device of claim 6, wherein the power supply detector adjusts the frequency control signal such that the frequency of the count clock signal generated by the clock generator increases as the temperature increases.

8. The SSD device of claim 3, wherein the auxiliary power supply circuit includes:

a charging circuit configured to charge the auxiliary power storage element using the supply voltage when the supply voltage is provided through the power line.

9. The SSD device of claim 3, wherein the controller performs, in response to the reprogram command, the reprogram operation on the plurality of nonvolatile memory devices using the auxiliary operation voltage.

10. The SSD device of claim 9, wherein the logic circuit deactivates the power enable signal in response to the reprogram finish signal, and wherein the auxiliary power supply circuit stops generating the auxiliary operation voltage while the power enable signal is deactivated.

11. The SSD device of claim 9, wherein the controller performs, in response to the reprogram command, the reprogram operation by selecting a reprogram block from among a plurality of blocks included in the plurality of nonvolatile memory devices, reading data stored in the reprogram block, programming the read data in another block, and erasing the reprogram block.

12. The SSD device of claim 11, wherein the controller determines a bit error rate of at least one page included in each of the plurality of blocks, and determines a block including a page, which has the bit error rate greater than a reference value, as the reprogram block.

13. The SSD device of claim 11, wherein the controller stores a time at which a program operation is lastly performed on at least one page included in each of the plurality of blocks, and determines a block including a page, on which the program operation is not performed during more than a reference time, as the reprogram block.

14. A storage system, comprising:

a solid state drive (SSD) device configured to store data and generate an auxiliary supply voltage; and a host configured to provide a supply voltage to the SSD device through an external power line, and to control the SSD device, wherein the SSD device moves at least a portion of the data stored in a first physical area of the SSD device to a second physical area of the SSD device periodically every first period using the auxiliary supply voltage, when provision of the supply voltage from the host through the power line is stopped, and wherein the SSD device comprises:

a controller configured to control the plurality of nonvolatile memory devices and output a reprogram finish signal after completing the move;

a main power supply circuit configured provide an operation voltage to the plurality of nonvolatile memory devices and the controller using the supply voltage, and generate an internal supply voltage based on the supply voltage; and an auxiliary reprogram device configured to receive the internal supply voltage through an internal power line connecting the main power supply circuit and the auxiliary program device, provide an auxiliary operation voltage to the plurality of nonvolatile memory devices and the controller when no longer receiving the internal supply voltage, and stop generating the auxiliary operation voltage in response to receipt of the reprogram finish signal.

15. The storage system of claim 14, wherein the auxiliary reprogram device is configured to control the controller using the auxiliary supply voltage to periodically perform a reprogram operation on the plurality of nonvolatile memory devices during the first period when the provision of the supply voltage is stopped.

16. A solid state drive (SSD) device, comprising:
a plurality of nonvolatile memory devices;
a controller configured to control the plurality of nonvolatile memory devices;
a main power supply circuit electrically coupled to the plurality of nonvolatile memory devices and the controller; and
an auxiliary reprogram device including an auxiliary power storage element electrically coupled to the plurality of nonvolatile memory devices and the controller,
wherein the main power supply is configured to provide an operation voltage to the plurality of nonvolatile memory devices and to charge the auxiliary power storage element using a supply voltage provided through a power line, and
wherein the auxiliary reprogram device provides an auxiliary supply voltage to the nonvolatile memory devices, generates a reprogram command and provides the reprogram command periodically every first period to the controller after the supply voltage stops being provided through the power line for a predetermined time,
wherein a duration of the first period is based on a temperature detected by the SSD device.

17. The SSD device of claim 16, wherein the controller, in response to the reprogram command, performs a reprogram operation while the supply voltage is not provided through the power line.

18. The SSD device of claim 16, wherein the auxiliary reprogram device further includes:
a logic circuit configured to determine whether the supply voltage is being provided through the power line; and
an auxiliary power supply circuit configured to:
charge the auxiliary power storage element when the supply voltage is provided through the power line; and
receive an auxiliary supply voltage from the auxiliary power storage element when the supply voltage is not provided through the power line and generate a logic operation voltage and an auxiliary operation voltage using the auxiliary supply voltage.

19. The SSD device of claim 18, wherein the auxiliary power supply circuit includes:
a DC/DC converter receiving the auxiliary supply voltage and generating the logic operation voltage and the auxiliary operation voltage; and
a charging circuit receiving the supply voltage and charging the auxiliary power storage element using the supply voltage.

20. The SSD device of claim 18, wherein the logic circuit includes a power supply detector determining whether the supply voltage has stopped being provided for the predetermined time, and wherein the predetermined time is set to prevent loss of data stored in the plurality of the nonvolatile memory devices.

* * * * *